United States Patent
Yamazaki et al.

(10) Patent No.: US 7,485,586 B2
(45) Date of Patent: Feb. 3, 2009

(54) LASER IRRADIATING APPARATUS AND METHOD OF MANUFACTURING SEMICONDUCTOR APPARATUS

(75) Inventors: Shunpei Yamazaki, Setagaya (JP); Koichiro Tanaka, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 8 days.

(21) Appl. No.: 11/595,921

(22) Filed: Nov. 13, 2006

(65) Prior Publication Data

US 2007/0059949 A1    Mar. 15, 2007

Related U.S. Application Data

(62) Division of application No. 10/125,529, filed on Apr. 19, 2002, now Pat. No. 7,253,032.

(30) Foreign Application Priority Data

Apr. 20, 2001 (JP) ............... 2001-123308

(51) Int. Cl.
  *H01L 21/26* (2006.01)
(52) U.S. Cl. ............... 438/795; 438/149; 257/E21.134; 257/E21.347
(58) Field of Classification Search ............ 438/149, 438/487, 488, 935, 795; 257/E21.134, E21.347, 257/E21.32
See application file for complete search history.

(56) References Cited

U.S. PATENT DOCUMENTS

| | | | |
|---|---|---|---|
| 4,879,176 A | 11/1989 | Ouderkirk et al. | |
| 5,212,116 A | 5/1993 | Yu | |
| 5,244,819 A | 9/1993 | Yue | |
| 5,352,291 A | 10/1994 | Zhang et al. | |

(Continued)

FOREIGN PATENT DOCUMENTS

EP    0 651 431    5/1995

(Continued)

OTHER PUBLICATIONS

K. Suga et al., *P-3: The Effect of a Laser Annealing Ambient on the Morphology and TFT Performance of Poly-Si Films*, SID 00 Digest, SID International Symposium Digest of Technical Papers, 2000, pp. 534-537.

*Primary Examiner*—Charles D. Garber
*Assistant Examiner*—Stanetta D Isaac
(74) *Attorney, Agent, or Firm*—Eric J. Robinson; Robinson Intellectual Property Law Office, P.C.

(57) ABSTRACT

First laser light is irradiated (energy density of 400 to 500 $mj/cm^2$) to a semiconductor film 102 in an atmosphere containing oxygen in order to obtain a semiconductor film 102b having large depressions and projections on the surface. Then, an oxidized film 105a formed by the irradiation of the first laser light is removed. After that, an inert gas with an oxygen density of 10 ppm or below is blown thereto, and, at the same time, second laser light is irradiated thereto (the energy density is higher than that of the irradiation of the first laser light). Thus, the surface of the semiconductor film 102b is flattened, and a semiconductor film 102c having fewer depressions and projections on the surface can be obtained.

46 Claims, 22 Drawing Sheets

U.S. PATENT DOCUMENTS

| | | | |
|---|---|---|---|
| 5,525,550 A | 6/1996 | Kato |
| 5,529,937 A | 6/1996 | Zhang et al. |
| 5,578,520 A | 11/1996 | Zhang et al. |
| 5,604,153 A | 2/1997 | Tsubouchi et al. |
| 5,608,232 A | 3/1997 | Yamazaki et al. |
| 5,643,826 A | 7/1997 | Ohtani et al. |
| 5,776,812 A | 7/1998 | Takahashi et al. |
| 5,789,284 A | 8/1998 | Yamazaki et al. |
| 5,808,321 A | 9/1998 | Mitanaga et al. |
| 5,843,833 A | 12/1998 | Ohtani et al. |
| 5,861,337 A | 1/1999 | Zhang et al. |
| 5,899,709 A | 5/1999 | Yamazaki et al. |
| 5,923,962 A | 7/1999 | Ohtani et al. |
| 5,956,579 A | 9/1999 | Yamazaki et al. |
| 5,956,581 A | 9/1999 | Yamazaki et al. |
| 5,960,323 A | 9/1999 | Wakita et al. |
| 6,027,960 A | 2/2000 | Kusumoto et al. |
| 6,048,588 A | 4/2000 | Engelsberg |
| 6,066,516 A | 5/2000 | Miyasaka |
| 6,071,796 A | 6/2000 | Voutsas |
| 6,072,194 A | 6/2000 | Wakita et al. |
| 6,096,581 A | 8/2000 | Zhang et al. |
| 6,124,154 A | 9/2000 | Miyasaka |
| 6,162,667 A | 12/2000 | Funai et al. |
| 6,242,291 B1 | 6/2001 | Kusumoto et al. |
| 6,242,292 B1 | 6/2001 | Yamazaki et al. |
| 6,285,042 B1 | 9/2001 | Ohtani et al. |
| 6,300,176 B1 | 10/2001 | Zhang et al. |
| 6,304,329 B1 | 10/2001 | Nitta et al. |
| 6,329,269 B1 | 12/2001 | Hamada et al. |
| 6,335,541 B1 | 1/2002 | Ohtani et al. |
| 6,337,259 B1 | 1/2002 | Ueda et al. |
| 6,348,369 B1 | 2/2002 | Kusumoto et al. |
| 6,436,745 B1 | 8/2002 | Gotou et al. |
| 6,444,507 B1 | 9/2002 | Miyasaka |
| 6,486,437 B2 | 11/2002 | Tanabe |
| 6,517,642 B2 | 2/2003 | Horie et al. |
| 6,528,359 B2 | 3/2003 | Kusumoto et al. |
| 6,534,353 B1 | 3/2003 | Kuramasu et al. |
| 6,559,036 B1 | 5/2003 | Ohtani et al. |
| 6,673,126 B2 | 1/2004 | Miyasaka |
| 6,706,568 B2 | 3/2004 | Nakajima |
| 6,803,296 B2 | 10/2004 | Miyairi |
| 6,855,584 B2 | 2/2005 | Yamazaki et al. |
| 6,906,344 B2 | 6/2005 | Yamazaki et al. |
| 2002/0043660 A1 | 4/2002 | Yamazaki et al. |
| 2002/0153360 A1 | 10/2002 | Yamazaki et al. |
| 2003/0139066 A1 | 7/2003 | Kusumoto et al. |
| 2005/0019997 A1 | 1/2005 | Kusumoto et al. |
| 2005/0112850 A1 | 5/2005 | Yamazaki et al. |

FOREIGN PATENT DOCUMENTS

| | | |
|---|---|---|
| JP | 07-183540 | 7/1995 |
| JP | 08-078329 | 3/1996 |
| JP | 09-102467 | 4/1997 |
| JP | 2001-015435 | 1/2001 |
| JP | 2001-060551 | 3/2001 |
| JP | 2002-93738 | 3/2002 |

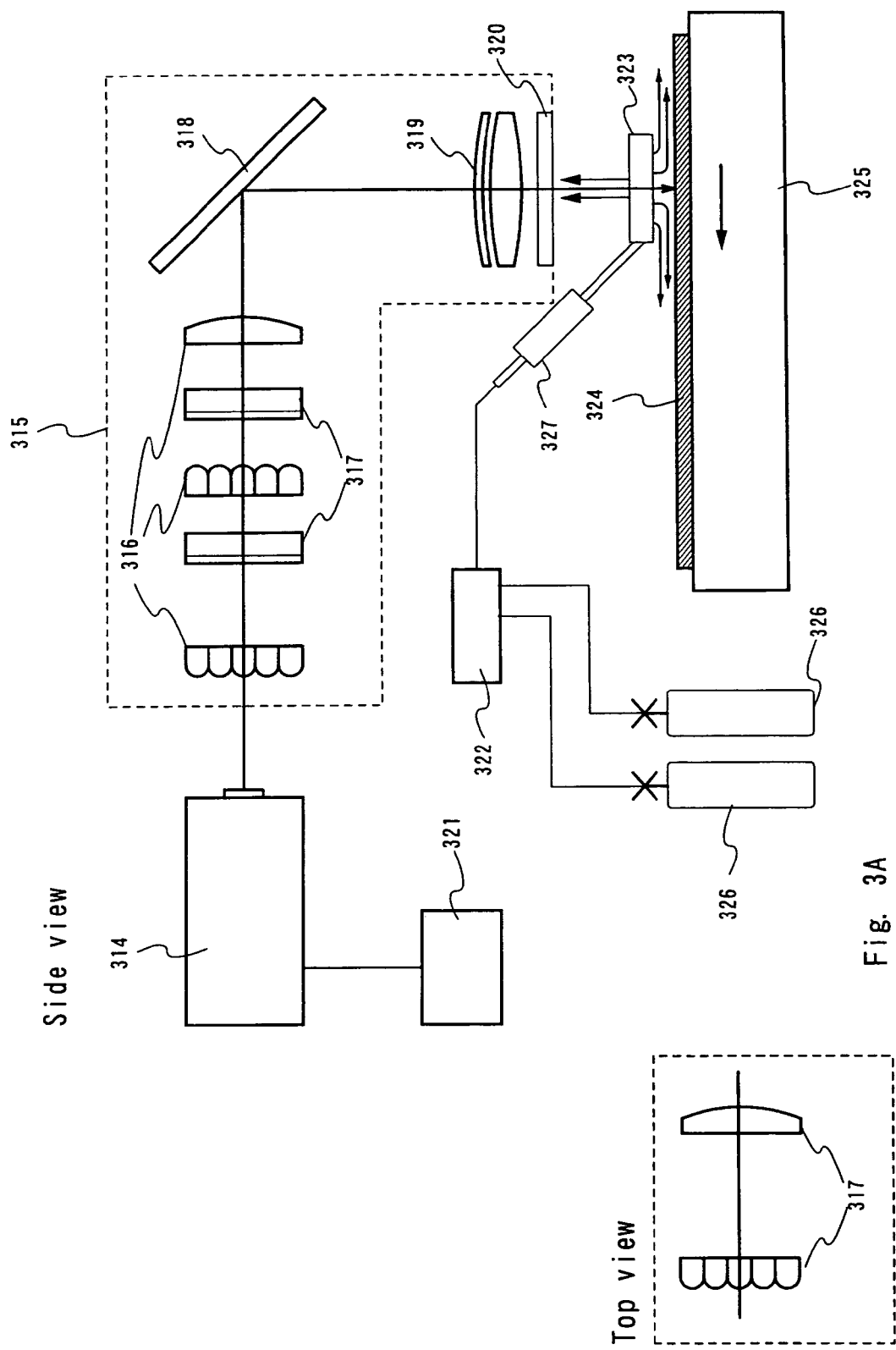

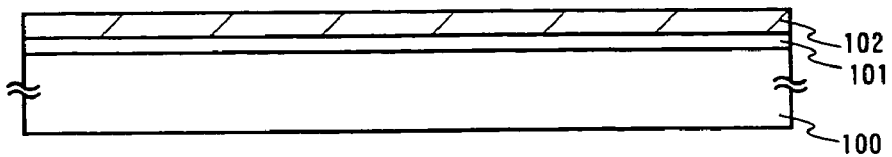
Fig. 4A
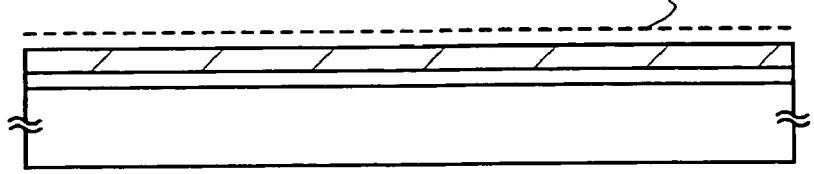
Fig. 4B
Fig. 4C
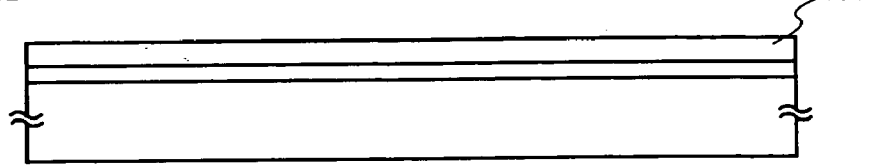
Fig. 4D
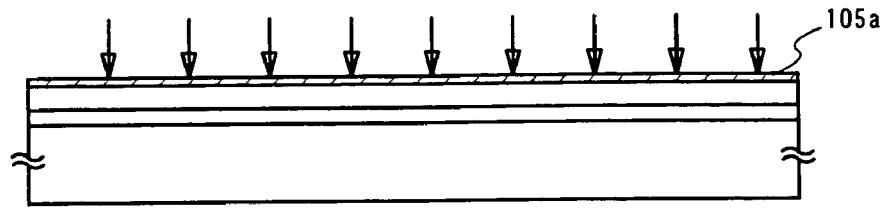
Fig. 4E
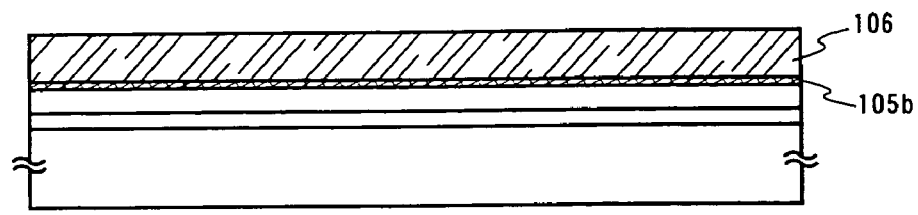
Fig. 4F
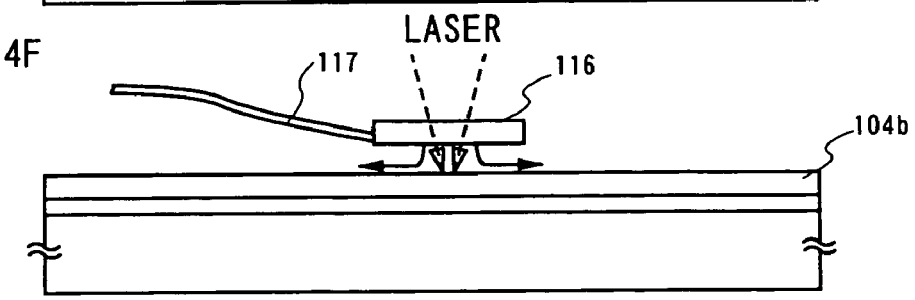
Fig. 4G

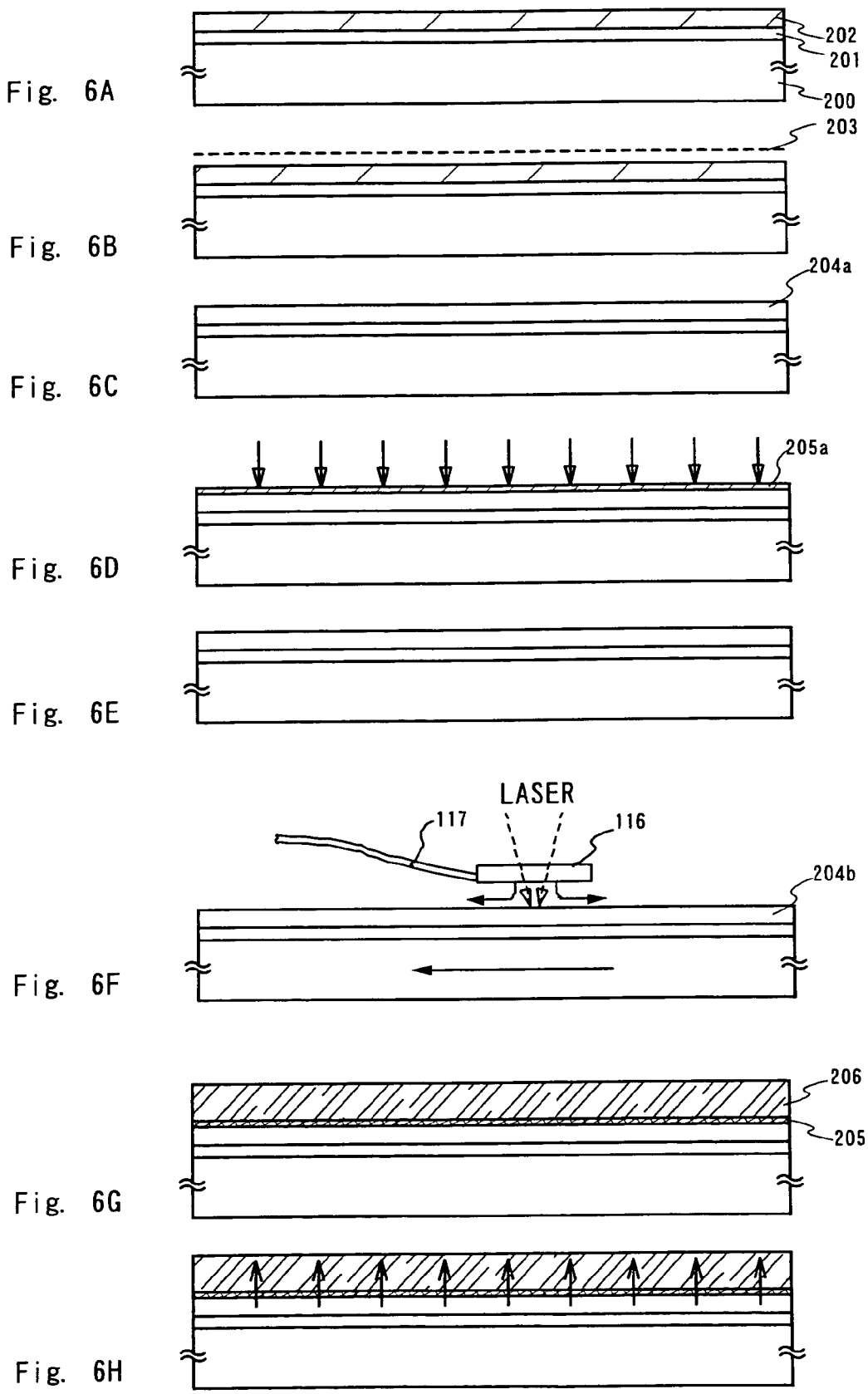

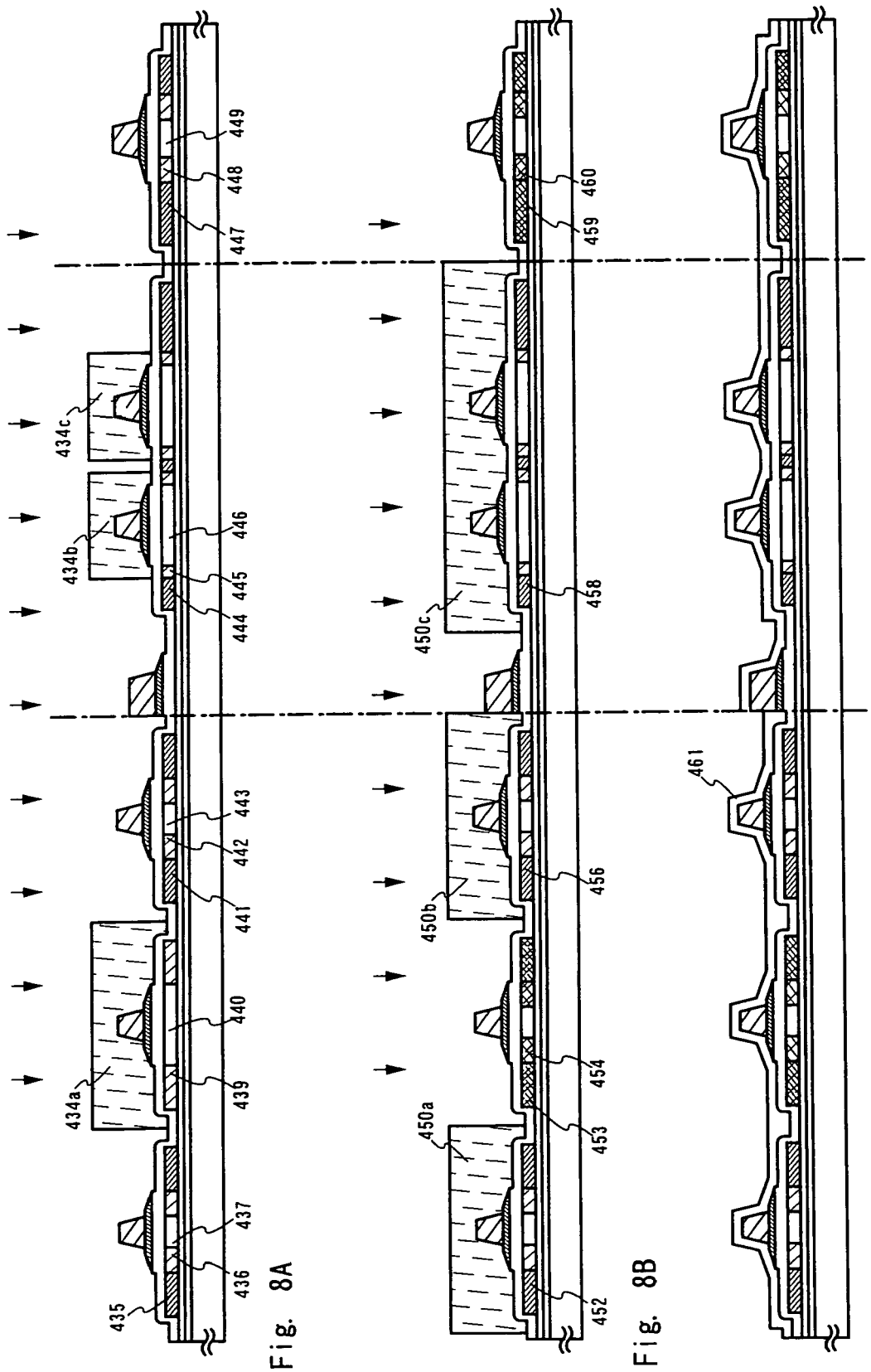

Distribution of off current value in n-channel TFT.

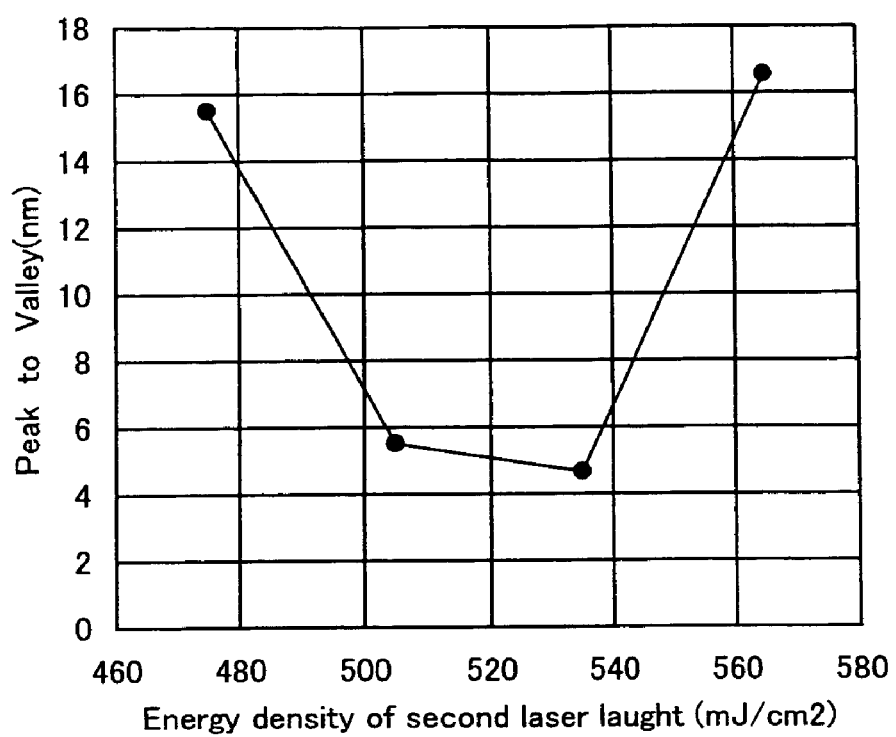
Fig. 15 Relation of surface roughness (P-V) and energy density

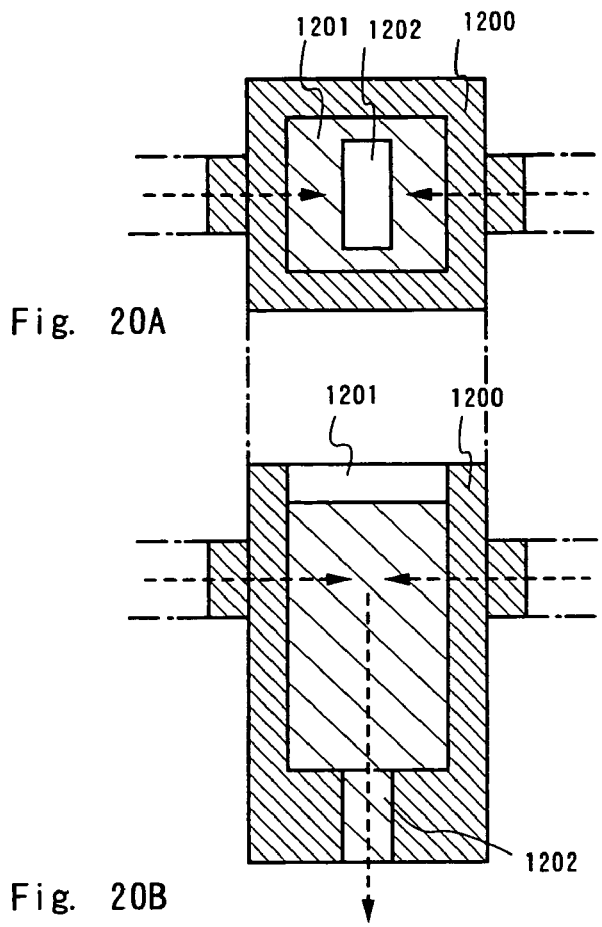
Fig. 20A
Fig. 20B
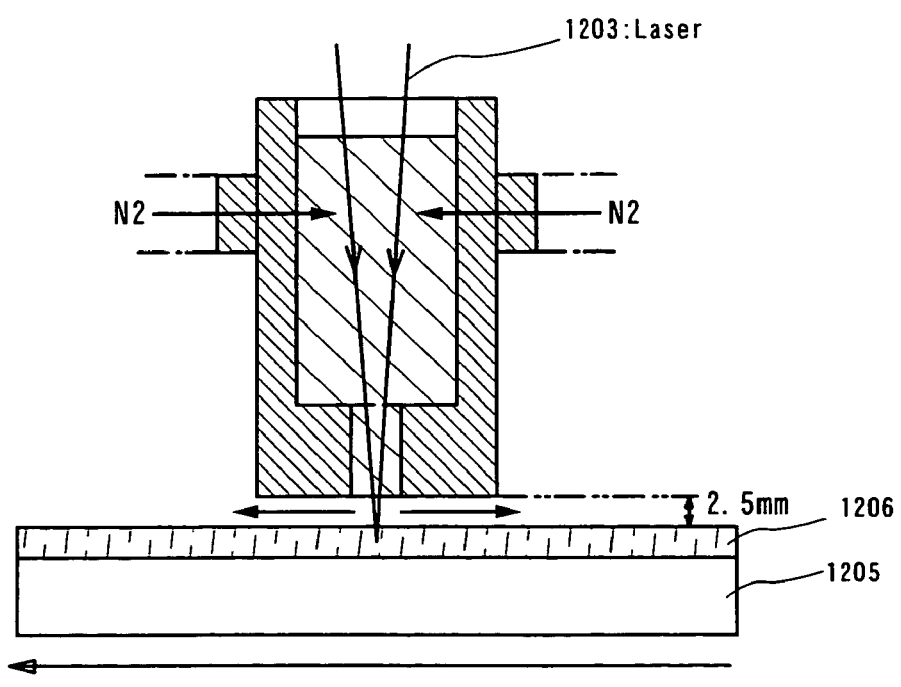
Fig. 20C

LASER IRRADIATING APPARATUS AND METHOD OF MANUFACTURING SEMICONDUCTOR APPARATUS

BACKGROUND OF THE INVENTION

1. Field of the Invention

The present invention relates to a method of manufacturing a semiconductor device, including a step of annealing a semiconductor film by using laser or equivalent strong light. The semiconductor apparatus refers to all of devices, which can function by using semiconductor characteristics and may be an electro-optical device, such as a liquid crystal display device, an electronic apparatus including an electro-optical device as its component, and a light emitting device.

2. Description of the Related Art

A technology is widely known whereby laser annealing is performed on a semiconductor film formed on an insulating substrate, such as glass, for the crystallization, the improvement of crystalline characteristics, and/or the activation of dopant added to the semiconductor film. A silicon film may be used as the semiconductor film in many cases.

A glass substrate may be used as the insulating substrate in many cases. The glass substrate can be processed into a big area substrate of, for example, 600×720×0.7 mm in size. In addition to the glass substrate, quartz substrate may be used. However, it is significantly difficult for the quartz substrate to be processed into a big area substrate. The use of the glass substrate has many advantages, but there is a problem that the melting point of the glass substrate is lower than that of the quartz substrate. Since annealing the semiconductor film requires a higher temperature, there is a problem of deformation of the glass substrate when annealed. Laser annealing of the semiconductor film was devised in order to overcome the problems. Laser can emit significantly strong energy in a short period of time. Therefore, it is possible to heat an object in an unbalanced manner. Thus, it is possible only to increase the temperature of the semiconductor film without much increase in temperature of the glass substrate. Accordingly, laser is preferably used for annealing the semiconductor film formed on the glass substrate.

The crystalline semiconductor film obtained by using the technology includes many crystal grains and therefore is called polycrystalline semiconductor film. The polycrystalline semiconductor film has much higher mobility than that of an amorphous semiconductor film. Therefore, by using the polycrystalline semiconductor film, an active-matrix type of liquid crystal display device (a semiconductor device in which thin film transistors (TFT) for driving pixels and for a driving circuit are produced on one substrate) can be produced, which cannot be achieved by using a semiconductor device produced by using, for example, a conventional amorphous semiconductor film. Accordingly, the polycrystalline semiconductor film has a much higher characteristic than that of the amorphous semiconductor film.

On the other hand, a method is devised which can be performed by using thermal processing in a lower temperature in the crystallization process of the amorphous semiconductor film. The method is disclosed in Japanese Patent Application Laid Open No. 7-183540 in detail. Here, an example of the method of crystallization of an amorphous semiconductor film by heating will be described briefly. First of all, a small amount of an element such as nickel, palladium and lead is added to an amorphous semiconductor film. A method for the addition may be plasma processing, vapor deposition, ion-implantation, sputtering and solution coating. After the addition, the amorphous semiconductor film is heated for four hours in an atmosphere of nitrogen at 550° C., for example. Then, a polycrystalline semiconductor film is obtained. A heating temperature and a heating time, which are optimum for the crystallization, depend on the amount of the added element and/or the condition of the amorphous semiconductor film.

As described above, the crystallization by laser annealing can give high energy only to an amorphous semiconductor film without much increase in temperature of the substrate. Therefore, the crystallization by laser annealing can be used not only for a glass substrate with a lower distortion point but also for a plastic substrate. Laser annealing is used for a process of activating dopant added to the semiconductor film. In many cases, thermal annealing may be performed for the process.

In the present mass-production process, laser used for laser annealing is excimer laser. The excimer laser adopts the pulse system and therefore has a large output. Further, the excimer laser has a significantly high coefficient of absorption for a silicon film, which is often used for the semiconductor film. Therefore, the excimer laser is used for the mass production process. A laser-annealing method is preferably used, including the steps of forming laser light in the pulse system with a larger output on the irradiated surface such that it can be a spot of several centimeter square or a 10 cm or longer line in an optical system and scanning the laser light (or moving a position of irradiating the laser light with respect to the irradiated surface). This is because the method results in higher productivity and is excellent for industrial purposes.

Especially, when laser light whose form on the irradiated surface is linear (called linear beam, hereinafter) is used, unlike a case where spot-form laser light requiring up/down and right/left scanning, the laser light can be irradiated onto a large area only by scanning in the direction perpendicular to the direction of the linear beam, which results in higher productivity. Scanning in the direction perpendicular to the line direction is performed because the direction is the most efficient scanning direction. Due to the higher productivity, using linear beam resulting from forming laser with a large output in the pulse system in an appropriate optical system becomes a mainstream gradually. The linear beam is especially effective in mass production processing, which uses a large area substrate of 600×720×0.7 mm in size.

It is an object of the present invention to reduce unflatness formed on a surface of a semiconductor film when annealing the semiconductor film by using laser and, at the same time, to reduce the cost for a technology of reducing the unflatness.

A semiconductor film can be crystallized and/or the crystalline characteristics can be improved by irradiating laser onto a semiconductor film. However, during the processing, the semiconductor film is melted by laser energy and then returns to a solid state again. When it returns to the solid state, the semiconductor film forms innumerable nuclei. Each of the nuclei grows mainly in parallel with a surface of the semiconductor film and then produces a crystal grain. The adjacent crystal grains collide with each other during the growth of the crystal grains. Thus, very high projecting portions are formed on the semiconductor film. Especially when the semiconductor film is annealed by using laser in an atmosphere including oxygen, such as an atmosphere of air, the projecting portion grows significantly and can reach to substantially the same height as that of the thickness of the semiconductor film. In this way, projections and depressions are formed on the surface of the semiconductor film to which laser is irradiated. However, especially when a top-gate type TFT is produced, surfaces of the projections and depressions become an interface against a gate insulating film. Therefore, the projections and depressions cause variation in element characteristics and/or increase in off current values.

It is known that the growth of the projecting portion can be suppressed significantly if oxygen is removed from the atmosphere for annealing the semiconductor film by using laser. Therefore, the annealing is often performed in an atmosphere without oxygen, such as in an atmosphere of nitrogen or in a vacuum. Thus, the unflatness of the semiconductor film may be suppressed. However, in order to have the atmosphere of nitrogen or the vacuum for the laser annealing, a robust vacuum chamber, a vacuum exhaust device and/or a large amount of nitrogen supply are required, which increases the size of the apparatus and the cost. The present invention can reduce the cause to increase the cost. In other words, it is an object of the present invention to provide a device of flattening a surface of a semiconductor film by annealing the semiconductor film by using laser in an atmosphere without oxygen, without the use of a vacuum device, and to provide a method of manufacturing a semiconductor apparatus.

SUMMARY OF THE INVENTION

In order to achieve the objects, the present invention only turns an atmosphere extremely near a laser irradiated semiconductor film into an atmosphere without oxygen, such as an atmosphere of nitrogen, an atmosphere of a noble gas, and an atmosphere of hydrogen without the use of an expensive vacuum device. A gas having a lower reaction to the semiconductor film is called an inert gas. Hydrogen has a higher reaction than other gases, but it is assumed as a kind of the inert gasses herein. More specifically, a gas not containing oxygen is supplied to a portion, where laser is irradiated to the semiconductor film so as to form an atmosphere of less oxygen extremely locally.

Very strong airflow is formed, and a gas not containing oxygen is blown into an area where laser light is irradiated to the semiconductor film during the laser annealing. Alternatively, a flat plate is provided, to which a gas not containing oxygen can be injected extremely near the semiconductor film. Then, laser light is irradiated to the semiconductor film via the plate. Here, the plate is transparent to the laser light. In order to extremely reduce the density of oxygen near the area where laser light is irradiated to the semiconductor film, the plate may adopt a construction causing the plate to air-levitate with respect to the semiconductor film. That is, the plate is levitated by a gas injected from the plate. By adopting the construction, a distance between the plate and the semiconductor film may be 1 mm or below.

When a semiconductor film which undergoes laser-annealing in an atmosphere without oxygen is used to produce a TFT, for example, a characteristic of ON current values may be worse than that of a case where the semiconductor film which undergoes laser-annealing in an atmosphere with oxygen is used. In other words, when laser annealing is performed in the atmosphere without oxygen, the depressions and projections of the surface of the semiconductor film can be reduced. However, at the same time, the characteristics of the semiconductor may be reduced. In order to overcome the problems, a method is proposed whereby the laser annealing is performed multiple times.

According to the present invention, first laser light is irradiated to a semiconductor film in an atmosphere containing oxygen for crystallization. Then, an oxidized film, which is formed by the irradiation of the first laser light, is removed. After that, second laser light is irradiated to the semiconductor film in an atmosphere not containing oxygen in order to reduce depressions and projections of the surface of the semiconductor film, that is, to flatten the surface of the semiconductor film. Through these processes, the surface of the semiconductor film can be smooth without large decrease in current values of the TFT. Accordingly, the problems, especially, the increase in OFF current values can be suppressed.

When the energy density of laser used for the irradiation of the second laser light is increased to 5 to 15% higher than the energy density of the laser used for the irradiation of the first laser light, the flatness of the surface of the semiconductor film is significantly improved as compared with the condition before the irradiation. For example, the roughness of the surface is decreased to ½, ⅓ or below as compared with the condition before the irradiation.

After the irradiation of the first laser light, the oxidized film is removed. Furthermore, the second laser light is irradiated to the semiconductor film in an atmosphere of oxygen with density of 10 ppm or below. Then, the semiconductor is used to produce an n-channel TFT. FIG. 14 shows the statistics and probability distribution plotted by using ○ marks for the off current values (Vds=14V). For the comparison, FIG. 14 further shows the statistics and probability distribution plotted by using ● marks for the off current value of the n-channel TFT which only has undergone the irradiation of the first laser light. In FIG. 14, the vertical axis indicates percentage while the horizontal axis indicates the off current value. 50% on the vertical axis indicates an average of the off current values on the horizontal axis. As the variation in offset current values on the horizontal axis is increased, the width of the plotted area is also increased. It is apparent from FIG. 14 that the n-channel TFT having undergone the irradiation of the first and the second laser light (indicated by ○ marks) has a lower average offset current average value than that of the n-channel TFT having undergone only the irradiation of the first laser light (indicated by ● marks). It is also apparent that the n-channel TFT having undergone the irradiation of the first and the second laser light (indicated by ○ marks) has smaller variation in off current values of 3 to 20 pA.

By using a technology of reducing a period of time required for the crystallization of a semiconductor film having an amorphous structure by adding a very small amount of a metal element such as nickel, palladium and lead (disclosed in Japanese Patent Application Laid Open No. 7-183540), a semiconductor film can be obtained which has a crystalline structure with good characteristics by performing heating processing for four hours in an atmosphere of nitrogen at 550° C., for example. The technology can not only reduce the heating temperature required for the crystallization but also increase the characteristic of alignment of the crystal orientation to a single direction. Producing a TFT based on the semiconductor film with the crystalline structure can not only enhance the field-effect mobility but also decrease the threshold coefficient (S value). Thus, the electrical characteristic can be improved dramatically. When laser-annealing is performed in addition to the heating processing, the characteristics as a semiconductor film can be improved as compared with a case where either heating processing or laser-annealing is performed for the crystallization. The irradiation of the second laser light can be performed after the irradiation of the first laser light is performed as the laser-annealing and an oxidized film, which has been formed by the irradiation, is removed. Notably, in order to increase the characteristic, conditions for the heating processing and the laser annealing must be optimized.

The metal element (such as nickel, palladium and lead here) remains in the semiconductor film having the crystalline structure obtained in this way. It might not distribute in the film uniformly. However, the average density of the remained element is over $1\times10^{19}/cm^3$. A TFT and the other different kinds of semiconductor elements can be formed under the condition. However, a gettering technology, which is described below, is preferably used to remove the metal element. Thus, the variation and increase in off current values can be suppressed.

First of all, an oxidized film (barrier layer) is formed as an etching stopper on a semiconductor film having the crystalline structure. Then, a semiconductor film containing a noble gas element (gettering site) is formed. Next, gettering of a metal element is performed on the gettering site and removes the semiconductor film containing the noble gas element. Notably, the noble gas element may be a selected single or multiple kinds of He, Ne, Ar, Kr and Xe. By causing the element/elements to be contained in the semiconductor film, dangling bond and/or lattice distortion is formed in order to the gettering site.

When the gettering technology is applied, the gettering effect can be increased by irradiating the second laser light before the oxidized film is formed in order to improve the flatness of the semiconductor film. It is extremely effective that the semiconductor film is flattened by irradiating the second laser light before gettering is performed in order to reduce the projecting portions, which easily cause the segregation of the metal element/elements, on the surface of the semiconductor film. One aspect of the present invention is a method of manufacturing a semiconductor device including the steps of controlling an atmosphere extremely near an area of the semiconductor film subject to the laser irradiation to turn the atmosphere to an atmosphere containing oxygen when the irradiation of the first laser light is performed and to turn the atmosphere to an atmosphere not containing oxygen when the irradiation of the second laser light is performed in order to flatten the surface of the semiconductor film and performing gettering.

Alternatively, after the gettering technology is applied to remove the oxidized film, the second laser light can be irradiated in order to flatten the surface of the semiconductor film. Furthermore, when noble gas element is applied to the semiconductor film having the crystalline structure in order to form the semiconductor film containing the noble gas element, the irradiation of the second laser light can reduce or remove the noble gas element in the film.

According to one aspect of the present invention, there is provided a method of manufacturing a semiconductor apparatus including the first step of forming a semiconductor film on an insulating surface, and the second step of blowing an inert gas to the semiconductor film without intrusion of the air and, at the same time, irradiating laser light thereto in order to anneal the semiconductor film.

In this case, the density of oxygen contained in the inert gas is preferably 10 ppm or below. Thus, oxidization of the semiconductor film can be suppressed very well. Furthermore, the depressions and projections formed on the surface of the semiconductor film by the irradiation of the laser light can become smaller. In addition, when the speed of flowing the gas is significantly increased, the depressions and projections formed on the surface of the semiconductor film can be reduced. An air-knife may be used in order to increase the flowing speed.

According to another aspect of the present invention, there is provided a method of manufacturing a semiconductor apparatus including the first step of forming a semiconductor film on an insulating surface, and the second step of irradiating laser light through a plate levitated above the semiconductor film by an injected inert gas or a gas containing oxygen in order to anneal the semiconductor film.

A distance between the plate and the semiconductor film may be reduced by levitating the plate above the semiconductor film. Therefore, only the inert gas exists near the semiconductor film. Since the laser irradiation is performed through the plate, the plate may have a window through which laser light passes. Alternatively, the plate may have an opening portion through which laser light passes. Preferably, the plate has a window through which laser light passes on the laser light incident side and an opening portion on the laser light emitting side. Thus, the buoyant force of the plate is increased so that an amount of the flowing gas can be suppressed. Construction of the present invention can be adjusted the injection of not only the inert gas but also a gas containing oxygen. In addition, the construction of the present invention can be adjusted the injection of not only the inert gas and the gas containing oxygen but also other gas. Performing the injection of the gas containing oxygen and the irradiation of laser light at the same time facilitate the oxidization of the surface of the semiconductor, which improves the characteristic of the semiconductor film. Thus, the intrusion of impurities other than oxygen to the semiconductor film can be suppressed as compared with the laser light irradiation performed in the air.

According to another aspect of the present invention, there is provided a method of manufacturing a semiconductor apparatus including the first step of forming a semiconductor film on an insulating surface, the second step of irradiating laser light to the semiconductor film and forming a semiconductor film having a crystalline structure and an oxidized film on the semiconductor film, the third step of removing the oxidized film, and the fourth step of blowing an inert gas to the semiconductor film without intrusion of the air and, at the same time, irradiating laser light thereto in order to flatten the surface of the semiconductor film. Energy density of the laser light in the fourth step is preferably higher than energy density of the laser light in the second step. Thus the effect of flattening can be increased. An atmosphere when the laser light is irradiated in the second step may be the air or a mixed gas of oxygen and nitrogen. Thus, the characteristic of the semiconductor film can be improved.

According to another aspect of the present invention, there is provided a method of manufacturing a semiconductor apparatus including the first step of forming a semiconductor film on an insulating surface, the second step of irradiating laser light to the semiconductor film and forming a semiconductor film having a crystalline structure and an oxidized film on the semiconductor film, the third step of oxidizing the surface of the semiconductor film having the crystalline structure by using solution containing ozone, the fourth step of removing the oxidized film, and the fifth step of blowing an inert gas to the semiconductor film without intrusion of the air and, at the same time, irradiating laser light thereto in order to flatten the surface of the semiconductor film. Preferably, energy density of the laser light in the fifth step is higher than energy density of the laser light in the second step. Thus, the semiconductor film can be more flattened.

According to another aspect of the present invention, there is provided a method of manufacturing a semiconductor apparatus including the first step of forming a semiconductor film on an insulating surface, the second step of irradiating laser light to the semiconductor film and forming a semiconductor film having a crystalline structure and an oxidized film on the semiconductor film, the third step of removing the oxidized film, and the fourth step of blowing an inert gas to the semiconductor film without intrusion of the air and, at the same time, irradiating laser light thereto in order to flatten the surface of the semiconductor film. Energy density of the laser light in the fourth step is preferably higher than energy density of the laser light in the second step. Thus, the semiconductor film can be more flattened.

The inert gas may be nitrogen, noble gas, hydrogen or the mixed gas. Thus, the flattening of the semiconductor film can be achieved very well.

The inert gas is preferably heated to 50° C. or above. Thus, a shortfall of laser energy can be covered, and therefore laser light of larger size can be obtained.

The inert gas may contain 0.1 to 5% of hydrogen so as to combine with oxygen. Thus, the oxidization of the surface of the semiconductor can be more suppressed.

The laser light preferably has linear energy distribution on the surface of the semiconductor film. Thus, the irradiation of the laser can be performed efficiently.

According to another aspect of the present invention, there is provided a laser irradiating apparatus, including a laser oscillator, an optical system, a plate having an opening portion from which a gas is injected, a stage on which a substrate is located, and means of injecting a gas from the plate and levitating the plate above the substrate located on the stage.

According to another aspect of the present invention, there is provided a laser irradiating apparatus, including a laser oscillator, an optical system, a plate having an opening portion from which a gas is injected and a window having transparency against laser light emitted by the laser oscillator, a stage on which a substrate is located; and means of injecting a gas from the plate and levitating the plate above the substrate located on the stage.

In this case, the optical system preferably forms laser light emitted by the laser oscillator linearly on a surface where a substrate is located. Thus, the efficiency of laser processing is improved.

Preferably, the gas is an inert gas. Thus, the oxidization of the surface of the semiconductor film can be suppressed, and therefore depressions and projections formed on the surface of the semiconductor film can be reduced. When the gas is an inert gas with the oxygen density of 10 ppm or below, the oxidization of the surface of the semiconductor film can be prevented. The inert gas is preferably nitrogen, noble gas, hydrogen or the mixed gas, the intrusion of impurities to the semiconductor film can be suppressed.

A distance between the plate and the substrate is preferably 0.01 to 1 mm when the laser light is irradiated. Thus, an atmosphere near the substrate can be well controlled.

The laser irradiating apparatus may further include heating means for the gas. Thus, laser energy can be supplemented, and the area of the irradiated laser light can be increased. Then, the productivity is increased.

In this case, only laser light passing through the opening portion from which the inert gas is injected may be irradiated to the substrate selectively. Here, the opening portion can function as a slit.

The inventors performed experiments as follows:

Experiment

An experiment was performed in order to compare a method of performing the blow of nitrogen and the irradiation of laser light at the same time and a method of irradiating laser light while blowing nitrogen gas by means of an $N_2$ gun by using a jig shown in FIG. 20.

First of all, an amorphous semiconductor film (amorphous silicon film) was formed by using the PCVD method on a glass substrate. After solution containing nickel was coated thereon, spin coating was performed. Next, thermal processing using an electric furnace (at 450° C., and at 550° C. after one hour thermal processing, for four hours) was performed for the crystallization in order to obtain a semiconductor film having a crystalline structure (polysilicon film).

Laser light was irradiated to the semiconductor film having the crystalline structure under a condition as follows:

(Comparison Conditions)

FIG. 21A shows a photograph of a surface (dark vision and reflection mode, 500 zoom, and exposure time: 3.2 min) after excimer laser light was irradiated thereon in the air. In FIG. 21A, many small white points, which were depressions and projections, could be observed.

(First Condition)

After a thin oxidized film (not shown), which was formed on the surface of a semiconductor film having a crystalline structure was removed, the nitrogen blow and the irradiation of laser light were performed at the same time by using 1200 the jig 1200 shown in FIG. 20. FIG. 21B shows a photograph of a surface (dark vision and reflection mode, 500 zoom, and exposure time: 3.2 min) after the irradiation. In FIG. 21B, it was realized that the flatness was improved because the number of small white points was decreased as compared that shown in FIG. 21A.

FIG. 20A is a top view of the jig while FIG. 20B is a sectional view of the jig. The principle of the jig 1200 shown in FIG. 20 is substantially the same as that shown in FIG. 2A. The jig 1200 shown in FIG. 20 included a blocking plate of metal, having a window (such as quarts) through which laser light passes, a unit of introducing an inert gas (such as a nitrogen gas) to the inside of the jig 1200, and an opening portion 1202 of injecting the inert gas (such as a nitrogen gas). Here, an example is shown where the inert gas is introduced from two places to the inside of the jig.

The jig 1200 shown in FIG. 20 was fixed by keeping a space of 2.5 mm from the surface of a semiconductor film 1206 formed on a substrate 1205. The scanning of the laser light 1203 was performed by moving the substrate 1205. As shown in FIG. 20C, in the jig 1200, laser light 1203 passed and irradiated through the opening portion (hole) 1202 from which the nitrogen gas was injected. Therefore, both nitrogen gas and laser light passed through the same place (the opening portion 1202) in the jig 1200 shown in FIG. 20. The opening portion 1202 functioned as a slit, and laser light irradiated to places other than the opening portion 1202 was blocked. By using the jig 1200, the inert gas was blown, and, at the same time, the laser light was irradiated by preventing the semiconductor film 1206 from exposing to the air (especially to oxygen) in order to flatten the surface of the semiconductor film 1206.

(Second Condition)

A thin oxidized film (not shown) formed on a surface of a semiconductor film having a crystalline structure was not removed and laser light (a first time) was irradiated in the air. Then, the oxidized film of the surface was removed, and the nitrogen blow and the irradiation of laser light (a second time) was further performed at the same time by using the jig 1200 shown in FIG. 20. FIG. 21C shows a photograph of a surface (dark vision and reflection mode, 500 zoom, and exposure time: 3.2 min) after the irradiation. In FIG. 21C, it could be observed that the roughness of the surface of the semiconductor film could be reduced as compared with the surface condition of the semiconductor film having undergone the irradiation of laser light in the air (FIG. 21A), which was observed through a microscope, and that observed in the first condition (FIG. 21B). Accordingly, it could be realized that the surface could be flattened.

For the comparison with the case where laser light was irradiated by using the jig, laser light was irradiated by blowing the nitrogen gas by using an $N_2$ gun. In that case, when the nitrogen gas was blown, oxygen contained in the surrounding air was also caught, and no effect of flattening the surface of the semiconductor film could be observed.

A specific example is shown in FIGS. 22A and 22B where the jig shown in FIG. 20 is applied as a laser irradiating apparatus. FIG. 22A is a bottom view, and FIG. 22B is a sectional view. In FIGS. 22A and 22B, an inert gas was introduced to the jig from one place.

In FIGS. 22A and 22B, laser light 1303 emitted from a laser oscillator passed through an optical system 1304 located in a space charged with an inert gas. Light gathering and irradiation of laser light may be in a desirable form (rectangular or linear herein). Then, the laser light 1303 was irradiated to a semiconductor film 1306 on a substrate 1305. The optical system 1304 was divided by a first blocking plate 1301a. The first blocking plate 1301a defined windows 1300a and 1300b formed by a material having transparency to laser light emitted by the laser oscillator.

A stage (not shown) on which the substrate 1305 was located and a second blocking plate 1301b between the stage and the optical system 1304 were provided. The second blocking plate had an opening portion 1302 through which the laser light 1303 passed through and could inject an inert gas from the opening portion 1302. The second blocking plate 1301b shown in FIG. 22B was fixed to the first blocking plate 1301a by keeping a space of 2.5 mm from the surface of the semiconductor film 1306 formed on the substrate 1305. The scanning of the laser light 1303 was performed by moving the stage on which the substrate 1305 was located. By using a laser irradiating apparatus including a mechanism shown in FIGS. 22A and 22B, the inert gas was blown, and, at the same time, the laser light 1303 was irradiated by preventing the semiconductor film 1306 from exposing to the air (especially to oxygen) in order to flatten the surface of the semiconductor film 1306.

In addition, the irradiation system in FIG. 22 is not the combination of the laser irradiation device and the jig in FIG. 20. When the optical system in which nitrogen purge was done and the jig in FIG. 20 are simply combined, three windows (quartz) where the laser and gas pass through are needed. In this case, the loss of the laser energy in total becomes about 3% since the loss of the laser energy in one window is about 1%. On the other hand, there are two windows (quartz) in the irradiation system of FIG. 22, and the loss of the laser energy in total can be suppressed to about 2%.

According to another aspect of the present invention, there is provided a laser irradiating apparatus, including a laser oscillator, a first blocking plate, an optical system divided by the first blocking plate and being located in a space to which an inert gas is charged, a stage on which a substrate is located, and a second blocking plate between the stage and the optical system, wherein the first blocking plate has a window formed by a material having transparency against laser light emitted by the laser oscillator and wherein the second blocking plate has an opening portion through which laser light passes and causing an inert gas to inject from the opening portion.

In this case, the laser irradiating apparatus may further includes means of introducing an inert gas to a space between the first blocking plate and the second blocking plate, wherein the gas introduced by the means is injected only from the opening portion of the second blocking plate.

BRIEF DESCRIPTION OF THE DRAWINGS

FIGS. 3A and 3B are diagrams illustrating a third embodiment;

FIGS. 4A to 4G are diagrams illustrating a first embodiment mode;

FIGS. 6A to 6H are diagrams illustrating a second embodiment mode;

FIGS. 8A to 8C are sectional views illustrating the example of a process of manufacturing the thin film transistor;

FIG. 15 is a diagram showing a relationship between an energy density of a second laser light and P-V value;

FIGS. 20A to 20C are diagrams showing an example of a jig;

DESCRIPTION OF THE PREFERRED EMBODIMENTS

Figure 1:
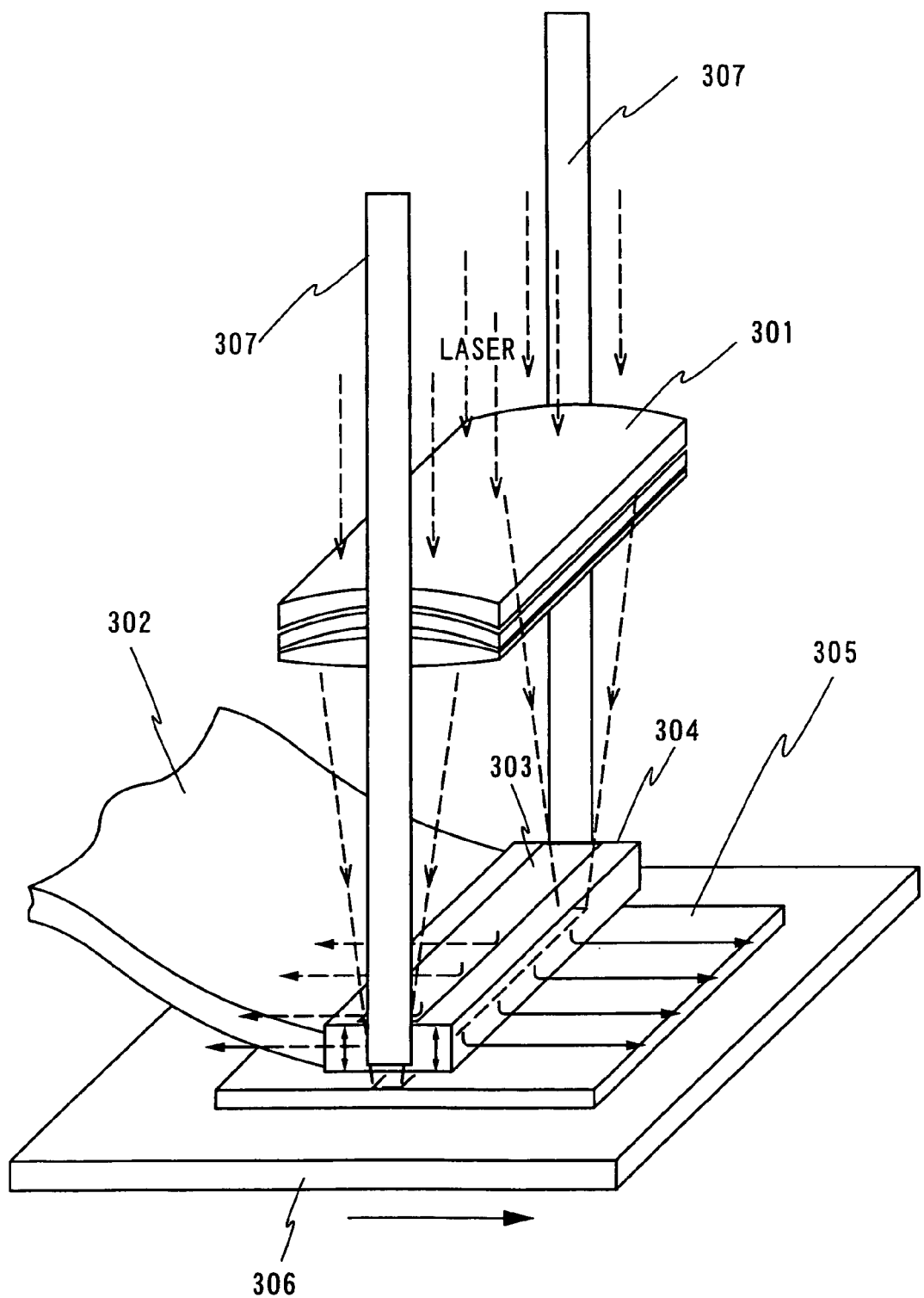
FIG. 1 is a diagram illustrating a first embodiment.

Embodiments of the present invention will be described below.

One aspect of the present invention includes a process of forming a semiconductor film on an insulating surface, a process of irradiating first laser light on the semiconductor film in the air or in an atmosphere of oxygen and forming a semiconductor film having a crystalline structure and an oxidized film on the semiconductor film, a process of removing the oxidized film, and a process of irradiating second laser light, which has high energy density of 5 to 15%, for example, and increases flatness of the semiconductor film, and, at the same time blowing a gas not containing oxygen to an area where the second laser light is irradiated. The process for of flattening the surface of the semiconductor film by irradiating the second laser light thereto may be performed after patterning the semiconductor film having the crystalline structure into a desired from.

Steps of manufacturing a typical TFT, which is manufactured by applying the present invention, will be described with reference to FIGS. 4 to 6.

First Embodiment Mode

FIG. 4A includes a substrate 100 having an insulating surface, an insulating film 101 functioning as a blocking layer, and a semiconductor film 102 having an amorphous structure.

In FIG. 4A, the substrate 100 may be a glass substrate, a quartz substrate or a ceramic substrate. Alternatively, the substrate 100 may be a silicon substrate, a metal substrate or a stainless substrate, which has an insulating film formed on the surface. The substrate 100 may be a plastic substrate having heat resistance, which withstands a processing temperature during the processes.

First of all, the primary insulating film 101 is formed which may be an oxide silicon film, a nitride silicon film or a silicon oxide nitride film ($SiO_xN_y$), on the substrate 100, as shown in FIG. 4A. In a typical example, the primary insulating film 101 has a two-layer structure in which first and second silicon oxide nitride films are stacked. The first silicon oxide nitride film is formed 50 to 100 nm thick by using $SiH_4$, $HN_3$ and $N_2O$ as a reaction gas. The second silicon oxide nitride film is formed in 100 to 150 nm thick by using $SiH_4$ and $N_2O$ as a reaction gas. Preferably, the one layer of the primary insulating layer 101 is a silicon nitride film (SiN film) or a second silicon oxide nitride film ($SiO_xN_y$ film (x>>y)) 10 nm thick or below. During gettering, nickel tends to easily move to an area with a higher density of oxygen. Therefore, it is extremely effective to have a silicon nitride film as the primary insulating film adjacent to the semiconductor film. Alternatively, the primary insulating film 101 may have a three layer structure in which a first silicon oxide nitride film, a second silicon oxide nitride film and a silicon nitride film are stacked sequentially.

Next, the first semiconductor film 102, which has an amorphous structure, is formed on the primary insulating film 101. The first semiconductor film 102 may be formed by using a semiconductor material mainly containing silicon. Typically, the first semiconductor film 102 may be an amorphous silicon film or an amorphous silicon germanium film and may be formed in 10 to 100 nm thick by the plasma CVD method, the vacuum CVD or the sputtering method. In order to obtain a semiconductor film having a good quality crystalline structure in later crystallization, the impurity density of oxygen and/or nitrogen contained in the first semiconductor film 102 having an amorphous structure may be $5\times10^{18}/cm^3$ (an atomic density measured by the Secondary Ion Mass Spectrometry: SIMS) or below. These impurities may prevent the later crystallization and may increase the density of the trapping center and/or the recombination center even after the crystallization. Thus, it is desirable that a material gas with high purity is used. Further, it is desirable to polish the interior of the reaction chamber (electric field polishing processing) and/or to use a CVD device compliant with ultra high vacuum including an oil-free vacuum exhausting system.

Next, the first semiconductor film 102 having the amorphous structure is crystallized by using a technology disclosed in Japanese Patent Laid Open No. 8-78329. According to the technology, a metal element, which facilitates the crystallization, is added to the amorphous silicon film, and heating processing is performed thereon. Thus, a semiconductor film having numberless of crystal grains grown as nuclei of the metal element is formed. First of all, nickel acetate solution containing a metal element (nickel, here) of 1 to 100 ppm on a weight basis, which has catalysis properties facilitating the crystallization, is coated on the surface of the first semiconductor film 102 having the amorphous structure by using a spinner. Thus, a nickel contained layer 103 is formed (FIG. 4B). In addition to the method of forming the nickel contained layer 103 by coating, a method may be used whereby an extremely thin film is formed by using sputtering method, vapor deposition method or plasma processing. While the example of coating performed on all the surface is described, a mask may be formed and a nickel contained layer may be selectively formed.

Next, heating processing is performed for the crystallization. In this case, silicide is formed at a portion of the semiconductor film where the metal element facilitating the crystallization of the semiconductor is formed, and the silicide is used as a nucleus in order to advance the crystallization. A first semiconductor film 104a having a crystalline structure shown in FIG. 4C is formed in this way. The density of oxygen of the first semiconductor film 104a after the crystallization is desirably $5\times10^{18}/cm^3$ or below. Here, after the thermal processing (at 450° C. for one hour) for the dehydrogenation, thermal processing for the crystallization (4 to 24 hours at 550° C. to 650° C.) is performed. When the crystallization is performed by irradiating strong light, any one or a combination of ultra-red light, visible light and ultra-violet light may be used. Typically, light is used which is emitted from a halogen lump, a metal halide lamp, a xenon-arc lamp, a carbon-arc lamp, a high-pressure sodium lamp or a high-pressure mercury lamp. The lamp light source is lighted up for 1 to 60 seconds or, preferably, for 30 to 60 seconds. The lightning may be repeated one to ten times until the semiconductor film is heated momentarily to the order of 600° C. to 1000° C. If necessary, thermal processing may be performed before the irradiation of the strong light in order to release hydrogen contained in the first semiconductor film 104a having the amorphous structure. Thermal processing and the irradiation of the strong light may be performed at the same time for the crystallization. In consideration of the productivity, the crystallization is preferably performed by the irradiation of the strong light.

The metal element (nickel, here) remains in the first semiconductor film 104a obtained in this way. The metal element does not distribute in the film uniformly, but the average density of the remained metal element is over $1\times10^{19}/cm^3$. A TFT and the other different kinds of semiconductor elements may be formed even under the condition, but the element is removed in accordance with a method as described below.

Next, in order to increase a rate of crystallization (a rate of a crystal component in a whole volume of the film) and to repair defects remained within crystal grains, laser light (first laser light) is irradiated to the first semiconductor film 104a having the crystalline structure in the air or in an atmosphere containing oxygen. When the laser light (the first laser light) is irradiated, depressions and projections as well as a thin oxidized film 105a are formed on the surface (FIG. 4D). The laser light (the first laser light) may be excimer laser light with a wavelength of 400 nm or below or may be the second or the third harmonic of YAG laser. Alternatively, light emitted from an ultra-violet lamp may be used instead of excimer laser light.

An oxide film is formed by using ozone contained solution (typically, ozone water), which is called chemical oxide. Then, a barrier layer 105b having an oxide film of 1 to 10 nm in total is formed. A second semiconductor film 106 containing a noble gas element is formed on the barrier layer 105b (FIG. 4E). Here, the oxide film 105a, which is formed when laser light is irradiated to the first semiconductor film 104a having the crystalline structure, is regarded as a part of the barrier layer, here. The barrier layer 105b functions as an etching stopper when only the second semiconductor film 106 is selectively removed in the later process. The chemical oxide may be formed similarly by using solution, in which sulfuric acid, hydrochloric acid or nitric acid and hydrogen peroxide solution are mixed, instead of the ozone contained solution. Alternatively, the barrier layer 105b may be formed by causing ozone by the irradiation of ultraviolet rays in an atmosphere of oxygen and then oxidizing the surface of the semiconductor film having the crystalline structure. The barrier layer 105b may be formed by depositing an oxidized film 1 to 10 nm thick by plasma CVD method, sputtering method or vapor-deposition method. Alternatively, the barrier layer 105b may be formed by using a clean oven to heat the semiconductor film at the order of 200 to 350° C. and then forming a thin oxidized film. The barrier layer 105b is not particularly limited if it is formed by using any one of or a combination of the above-described methods. However, the proper quality or thickness of the barrier layer 105b are required so that nickel contained in the first semiconductor film can move to the second semiconductor film during later gettering.

Here, the second semiconductor film 106 containing a noble gas element is formed by using sputtering method, and then a gettering site is formed (FIG. 4E). The sputtering condition is desirably adjusted as appropriate in order to prevent the noble gas element from being added to the first semiconductor film. The noble gas element may be any one or multiple kinds of helium (He), neon (Ne), argon (Ar), krypton (Kr) and xenon (Xe). Among the above, Argon (Ar) is preferable because of the low price. Here, a target having silicon is used in an atmosphere containing the noble gas element to form the second semiconductor film. There are two reasons why a noble gas element ion, which is an inert gas, is contained in the film. One reason is for forming a dangling bond to give distortion in the semiconductor film. The other reason is for giving interstitial distortion in the semiconductor film. The interstitial distortion in the semiconductor film may be significantly obtained when an element with a larger atomic radius than that of silicon is used such as argon (Ar), krypton (Kr), and xenon (Xe). Furthermore, containing the noble gas element in the film may not only cause the lattice distortion but also form dangling bond, which contributes to the gettering action.

When the second semiconductor film is formed by using a target containing phosphorous, which is one conductivity type of impurity element, Coulomb force of phosphorous may be used to perform gettering in addition to the gettering by using the noble gas element.

Nickel tends to easily move to an area with higher density of oxygen during the gettering. Therefore, the density of oxygen contained in the second semiconductor film 106 is desirably higher than the density of oxygen contained in the first semiconductor film, such as $5 \times 10^{18}/cm^3$ or above.

Next, gettering for reducing a density of or removing a metal element (nickel, here) in the first semiconductor film is performed by performing heating processing (FIG. 4F). The heating processing for performing the gettering may be processing of irradiating strong light or thermal processing. By performing the processing, the metal element is moved in the direction indicated by arrows in FIG. 4F (that is, in the direction from the substrate side to the surface of the second semiconductor film). The metal element contained in the first semiconductor film 104a moves to the second semiconductor film 106 via the barrier layer 105b. The processing reduces the density of the metal element in the first semiconductor film. A distance that the metal element moves during the gettering may be equal to at least the thickness of the first semiconductor film. Thus, the gettering can be completed in a shorter period of time. Here, it is enough if a condition can be obtained where nickel does not segregate to the first semiconductor film 104a. More specifically, the sufficient gettering is needed only such that nickel contained in the first semiconductor film 104a cannot exist very much, that is, the density of nickel in the film can be $1 \times 10^{18}/cm^3$ or below or desirably $1 \times 10^{17}/cm^3$ or below.

Furthermore, the rate of crystallization of the first semiconductor film may be increased at the same time as the gettering depending on the condition for heating processing in the gettering. Thus, the defects remained within the crystal grains can be repaired. That is, the crystalline characteristic can be improved.

The term "gettering" refers herein to that a metal element in a gettered area (the first semiconductor film here) is released due to thermal energy and moves to a gettering site due to the diffusion.

When processing of irradiating strong light is used as heating processing in the gettering, the lamp light source for heating is lighted up for one to 60 seconds or preferably for 30 to 60 seconds. It is repeated 1 to 10 times or preferably 2 to 6 times. The strength of emitting light from the lamp light source may be arbitrary. However, at least, the semiconductor film must be heated momentarily at the order of 600 to 1000° C. or preferably 700 to 750° C.

In order to prevent oxidization, the thermal processing may be performed for 1 to 24 hours in an atmosphere of nitrogen at 450 to 800° C. or, for example, at 550° C. for 14 hours. In addition to the thermal processing, strong light may be irradiated.

Next, by using the barrier layer 105b as an etching stopper, only the second semiconductor film 106 is removed selectively. Then, the barrier layer 105b including an oxidized film is removed. Only the second semiconductor film may be etched selectively by dry-etching, which does not use plasma but ClF$_3$, or by wet-etching by using alkali solution such as solution containing hydrogen or tetraethylammoniumhydrooxide (Chemical Formula (CH$_3$)$_4$NOH). After the second semiconductor film is removed, high density of nickel is detected when the nickel density on the surface of the barrier layer is measured by using TXRF. Therefore, the barrier layer is desirably removed by using an etchant containing hydrofluoric acid.

Next, laser light (second laser light) is irradiated to the first semiconductor film having the crystalline structure while, at the same time, a gas not containing oxygen (such as nitrogen and helium) is blown to the area of the semiconductor film where laser light is irradiated. Thus, an atmosphere with less oxygen can be achieved near the area of the semiconductor film where laser light is irradiated. In order to further increase the effect of blowing the gas, a plate 116 to which the gas is injected is located immediately above the semiconductor film to which the laser light is irradiated. The plate 116 may be air levitated above the semiconductor film. The gas is supplied to the plate 116 via a gas feed tube 117. The plate 116 is held by using a proper support, not shown, in order to suppress the displacement. Here, a distance between the plate 116 and the semiconductor film may be the order of 0.01 to 1 mm. The narrower distance is preferred. The similar effect can be expected if the plate is provided near the semiconductor film even when the plate is not air-levitated. In this case, the distance may be the order of 1 to 5 mm in order to eliminate a possibility that the plate and the substrate touch each other. The plate 116 may have about 40 mm longer sides than those of the area (rectangular, here) to which the laser light is irradiated.

It is understood from experiments that, when laser light is irradiated to the semiconductor film under a condition that the density of oxygen is reduced, the surface of the semiconductor film is flattened by proper energy. In other words, when laser light (the second laser light) is irradiated with proper energy in an atmosphere of oxygen with the density of 10 ppm or below, differences in height of depression and projections (a P-V value; Peak to Valley: a difference between a maximum value and a minimum value of the heights) formed by the irradiation of the first laser light is reduced, that is, flattened (FIG. 4G). Here, the P-V values of the depressions and projections may be observed by using an atomic force microscope (AFM). More specifically, the surface having about 10 nm to 30 nm P-V value of the depressions and projections formed by the irradiation of the first laser light may be reduced to 5 nm or below due to the irradiation of the second laser light. The laser light (second laser light) may be excimer laser light with a wavelength of 400 nm or below or second harmonic or third harmonic of YAG laser. Instead of the excimer laser light, light emitted from an ultra-violet light lamp may be used.

The present inventors carried out an experiment described below:

First Experiment

First of all, a test sample was prepared in which a primary insulating film (silicon oxide nitride film 150 nm thick was formed, and an amorphous silicon film 54 nm thick is formed thereon by using plasma CVD method. Next, after coating solution containing 10 ppm nickel on a weight basis, thermal processing at 500° C. was performed for one hour. Then, thermal processing at 550° C. was performed for four hours for the crystallization. Thus, a silicon film having a crystalline structure was formed. Next, the surface of the semiconductor film was cleaned by noble hydrofluoric acid. Then, first laser light (excimer laser) was irradiated thereto in the air or in an atmosphere containing oxygen. Here, the energy density of the first laser light was 476 mj/cm$^2$. Next, the oxidized film formed when the first laser light was irradiated was removed by noble hydrofluoric acid. Then, the second laser light with the variety of energy densities (476, 507, 537 and 567 mj/cm$^2$) were irradiated in an atmosphere of nitrogen in order to measure and compare P-V values.

FIG. 15 shows the result of the experiment.

It is apparent from FIG. 15 that the energy density of the second laser light was larger than the energy density of the first laser light, preferably 30 to 60 mj/cm$^2$ larger (about 5 to 15% of the energy density of the first laser light). However, when the energy density of the second laser light was 90 mj/cm$^2$ or above larger than the energy density of the first laser light, the roughness of the surface was increased. In addition, the crystalline characteristic was reduced, or microcrystallization was caused, which deteriorated the characteristic.

The energy density of the irradiated second laser light was higher than the energy density of the first laser light. However, the crystal characteristic did not change very much before and after the irradiation. Further, the crystal condition such as a grain size did not change very much. It could be supposed that the irradiation of the second laser light only flattened the surface.

The merit is significantly large that the semiconductor film having the crystalline structure is flattened by the irradiation of the second laser light. For example, the improvement of the flatness allows forming a thinner gate insulating film later, which can improve the mobility of a TFT. The improvement of the flatness can reduce off current when the TFT is manufactured.

Figure 5A:
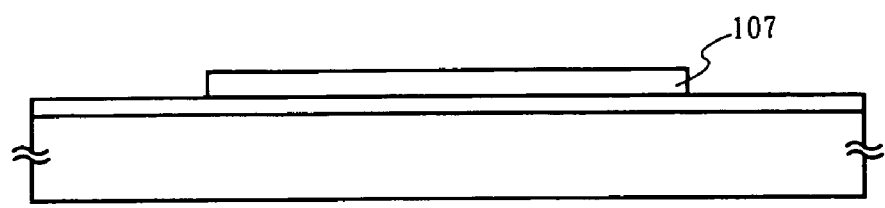
FIGS. 5A and 5B are diagrams illustrating the first embodiment mode.

Next, the flattened first semiconductor film 104b is processed by using a publicly known patterning technology into a semiconductor layer 107 in a desirable form (FIG. 5A). Before a resist mask is formed, a thin oxidized film is desirably formed on a surface of ozone water.

Next, the surface of the semiconductor layer is cleaned by an etchant including hydrofluoric acid. Then, an insulating film to be used as a gate insulating film 108 is formed which mainly contains silicon. The cleaning of the surface and the formation of the gate insulating film are desirably performed in series without any exposure to the air.

Next, after cleaning the surface of the gate insulating film 108, a gate electrode 109 is formed. Next, an impurity element (such as P and As), phosphorus here, which gives an n-type, is added to the semiconductor properly in order to form a source region 110 and a drain region 111 are formed. Then, the gate electrode 109 is etched slightly, and a smaller amount of phosphorus than the amount of phosphorus added to the source region 110 may be added thereto in order to form low doze regions 118 and 119. The low doze region is called lightly doped drain (LDD) region. The structure includes a region where a lower density of impurity element is added between a channel region and a source region or a drain region, which is formed by adding a higher density of impurity element. Furthermore, a gate-drain overlapped LDD (GOLD) structure may be adopted where the LDD region is located over the gate electrode through the gate insulating film.

After the addition, heating processing, the irradiation of strong light or the irradiation of laser light is performed in order to activate the impurity element. At the same time as the activation, the plasma damage on the gate insulating film or the plasma damage to an interface between the gate insulating film and the semiconductor layer can be recovered. Especially, it is significantly effective to irradiate the second harmonic of YAG laser from the top surface or the back surface in order to activate the impurity element in an atmosphere at room temperature to 300° C. The YAG laser is a preferable activation measure because it is easy to maintain. Alternatively, a process of laser irradiation, which is disclosed in the present invention, is preferably used because the depressions and the projections of the semiconductor film can be suppressed because the oxidization of the semiconductor film can be suppressed.

In the following process, an interlayer insulating film 113 is formed. Then, hydrogenation is performed thereon to form a contact hole reaching to the source region and the drain region. Then, a source electrode 114 and a drain electrode 115 are formed to complete a TFT (n-channel TFT) (FIG. 5B).

The density of the metal element contained in the channel region 112 of the TFT obtained in this way may be less than $1 \times 10^{17}/cm^3$. The flatness of the semiconductor surface of the TFT obtained in this way is dramatically improved by the above-described process. Therefore, the off current values are reduced, and the variation in off current values is also reduced.

Figure 5B:
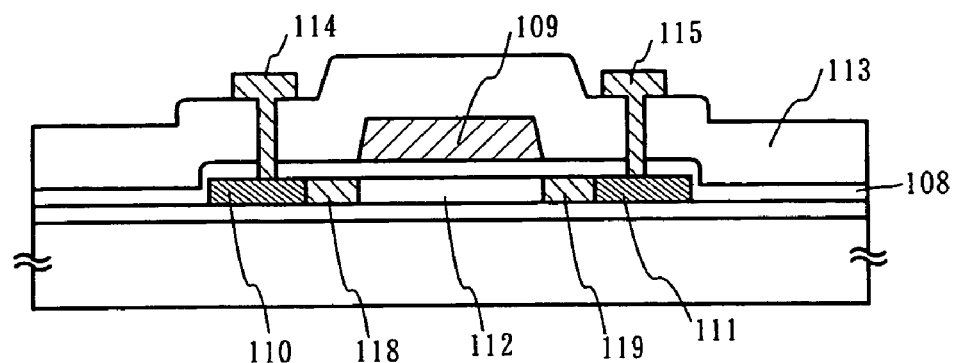

The present invention is not limited to the TFT structure in FIG. 5B. While the n-channel TFT is used for the illustrative purpose, a p-channel TFT may be formed by using a p-type impurity element instead on the n-type impurity element.

While the top gate type TFT is used as an example for the illustrative purpose, the present invention can be applied regardless of the TFT structure. For example, the present invention can be applied to a bottom gate type (or reverse stagger type) TFT and a forward stagger type TFT.

While the present invention is described by using an example where gettering using a semiconductor film including noble gas is used. However, ridges whereby a metal element can be easily segregate can be reduced according to the present invention. Therefore, the present invention is effective regardless of the gettering method. For example, the present invention can be applied to a method whereby phosphorus is added selectively to form a gettering site, and then heating processing is performed for gettering. The effect of gettering can be improved like the first embodiment.

It is not always necessary for the irradiation of the second laser light to be performed before patterning. Accordingly, after forming a semiconductor layer in a desired form by patterning and then removing an oxide film, the surface can be flattened by irradiating the second laser light with a gas not containing oxygen blown.

Second Embodiment Mode

FIGS. 6A to 6D show an example where the irradiation of the second laser light is performed in accordance with processes in an order different from that of the first embodiment.

First of all, according to the first embodiment, processes up to the irradiation of the first laser light are performed. Notably, FIGS. 6A to 6D correspond to FIGS. 4A to 4D, respectively.

FIG. 6A includes a substrate 200, an insulating film 201 functioning as a blocking layer, a semiconductor film 202 having an amorphous structure, a nickel contained layer 203, a semiconductor film 204a having a crystalline structure and an oxidized film 205a.

Next, the oxidized film 205a which is formed by the irradiation of the first laser light is removed (FIG. 6E).

Next, laser light (second laser light) is irradiated to the first semiconductor film having the crystalline structure while, at the same time, a gas not containing oxygen (such as nitrogen and helium) is blown to the area of the semiconductor film where laser light is irradiated. Thus, an atmosphere with less oxygen can be achieved near the area of the semiconductor film where laser light is irradiated. In order to further increase the effect of blowing the gas, a plate 116 to which the gas is injected is located immediately above the semiconductor film where the laser light is irradiated. The plate 116 may be air levitated above the semiconductor film. The gas is supplied to the plate 116 via a gas feed tube 117. The plate 116 is held by using a proper support, not shown, in order to suppress the displacement. Here, a distance between the plate 116 and the semiconductor film may be the order of 0.01 to 1 mm. The narrower distance is preferred. The similar effect can be expected if the plate is provided near the semiconductor film even when the plate is not air-levitated. The plate 116 may have about 40 mm longer sides than those of the area (rectangular, here) where the laser light is irradiated.

It is understood from experiments that, when laser light is irradiated to the semiconductor film under a condition where the density of oxygen is reduced, the surface of the semiconductor film is flattened by proper energy. In other words, when laser light (the second laser light) is irradiated with proper energy of oxygen with the density of 10 ppm or below, differences in height of depression and projections (a P-V value; Peak to Valley: a difference between a maximum value and a minimum value of the heights) formed by the irradiation of the first laser light is reduced, that is, flattened (FIG. 6F). More specifically, the surface having about 10 nm to 30 nm P-V value of the depressions and projections formed by the irradiation of the first laser light may be reduced to 5 nm or below due to the irradiation of the second laser light. The laser light (second laser light) may be excimer laser light with a wavelength of 400 nm or below or second harmonic or third harmonic of YAG laser. Instead of the excimer laser light, light emitted from an ultra-violet light lamp may be used. Here, the energy density of the second laser light is larger than the energy density of the first laser light, preferably 30 to 60 mj/cm$^2$ larger (about 5 to 15% of the energy density of the first laser light). However, when the energy density of the second laser light is 90 mj/cm$^2$ or above larger than the energy density of the first laser light, the crystalline characteristic is reduced, or micro-crystallization is caused, which deteriorated the characteristic.

The energy density of the irradiated second laser light is higher than the energy density of the first laser light. However, the crystalline characteristic does not change very much between before and after the irradiation. Further, the crystal condition such as a grain size does not change very much. It can be supposed that the irradiation of the second laser light only flattens the surface.

The merit is significantly large that the semiconductor film having the crystalline structure is flattened by the irradiation of the second laser light. For example, during the gettering performed later, nickel is easily segregated in ridges. Therefore, the gettering may be performed after flattening the surface by the irradiation of the second laser light. Then, the effect of gettering is increased. The improvement of the flatness allows forming a thinner gate insulating film later, which can improve the mobility of a TFT. The improvement of the flatness can reduce off current when the TFT is manufactured.

Next, an oxide film (called chemical oxide) is formed by using ozone contained solution (typically, ozone water). Then, a barrier layer 205b having an oxide film of 1 to 10 nm is formed. A second semiconductor film 206 containing a noble gas element is formed on the barrier layer 205b (FIG. 6G).

Alternatively, the barrier layer 205b may be formed by causing ozone by the irradiation of ultraviolet rays in an atmosphere of oxygen and then oxidizing the surface of the semiconductor film having the crystalline structure. The barrier layer 205b may be formed by depositing an oxidized film 1 to 10 nm thick by plasma CVD method, sputtering method or vapor-deposition method. Alternatively, the barrier layer 205b may be formed by using a clean oven to heat the semiconductor film at the order of 200 to 350° C. and then forming a thin oxidized film. The barrier layer 205b is not particularly limited if it is formed by using any one of or a combination of the above-described methods. However, the proper quality or thickness of the barrier layer 205b are required so that nickel contained in the first semiconductor film can move to the second semiconductor film during later gettering.

Here, the second semiconductor film 206 containing a noble gas element is formed by using the sputtering method, and then a gettering site is formed. The noble gas element may be any one or multiple kinds of helium (He), neon (Ne), argon (Ar), krypton (Kr) and xenon (Xe). Argon (Ar) is preferable because the gas is inexpensive. Here, a target having silicon is used in an atmosphere containing the noble gas element to form the second semiconductor film. There are two reasons why a noble gas element ion, which is an inert gas, is contained in the film. One reason is for forming a dangling bond to give distortion in the semiconductor film. The other reason is for giving interstitial distortion in the semiconductor film.

The interstitial distortion in the semiconductor film may be significantly obtained when an element with a larger atomic radius than that of silicon is used such as argon (Ar), krypton (Kr), and xenon (Xe). Furthermore, containing the noble gas element in the film may not only cause the lattice distortion but also form dangling bond, which contributes to the gettering action.

Next, gettering for reducing a density of or removing a metal element (nickel, here) in the first semiconductor film is performed by performing heating processing (FIG. 6H). The heating processing for performing the gettering may be processing of irradiating strong light or thermal processing. By performing the processing, the metal element is moved in the direction indicated by arrows in FIG. 6H (that is, in the direction from the substrate side to the surface of the second semiconductor film). The metal element contained in the first semiconductor film 204b moves to the second semiconductor film 206 via the barrier layer 205b. The processing reduces the density of the metal element in the first semiconductor film. A distance that the metal element moves during the gettering may be equal to at least the thickness of the first semiconductor film. Thus, the gettering can be completed in a shorter period of time. Here, it is enough if a condition can be obtained where nickel does not segregate to the first semiconductor film 204a. More specifically, the sufficient gettering is needed only such that nickel contained in the first semiconductor film 204a cannot exist very much, that is, the density of nickel in the film can be $1 \times 10^{18}/cm^3$ or below or desirably $1 \times 10^{17}/cm^3$ or below.

During the gettering, damages due to the irradiation of laser light (the first and the second laser light) are repaired at the same time.

Next, only the second semiconductor film 206 is removed selectively by using the barrier layer 205b as an etching stopper. Then, the barrier layer 205b is removed, and the first semiconductor film 204b is processed by using the publicly known technology into a semiconductor layer in a desired form.

Following processes complete a TFT in the same manner as the processes in the first embodiment.

This embodiment may be combined with the first embodiment. Furthermore, it may be combined with the other publicly known gettering technology.

It is not always necessary for the irradiation of the second laser light to be performed before gettering. Accordingly, after forming a semiconductor layer in a desired form and then removing an oxide film, the surface can be flattened by irradiating the second laser light with a gas not containing oxygen blown. The present invention having the above-described construction will be described in detail in following examples.

First Embodiment

An example of the present invention will be described with reference to FIGS. 16A to 16D. Here, an example is described where a method different from the crystallization method (crystallization method using nickel) described in the embodiment is used. More specifically, a method will be described in detail whereby a semiconductor film having an amorphous structure, which is provided on an insulating substrate, is annealed by laser.

First of all, a primary insulating film 1101 is formed on a glass substrate 1100 in accordance with the method in the embodiment. In this example, a two-layer structure is used for the primary insulating film 1101 provided on the glass substrate. However, a structure may be used where a single layer film, which is the insulating film itself, or at least two layers are stacked. As a first layer of the primary insulating film 1101, a first silicon oxide nitride film (compositional ratio: Si=32%, O=27%, N=24% and H=17%) is formed 50 nm thick by using $SiH_4$, $NH_3$ and $N_2O$ as a reaction gas by plasma CVD method. Next, as a second layer of the primary insulating film 1101, a second silicon oxide nitride film (compositional ratio: Si=32%, O=59%, N=7% and H=2%) is formed 100 nm thick by using $SiH_4$ and $N_2O$ as a reaction gas by plasma CVD method.

Figure 16A:
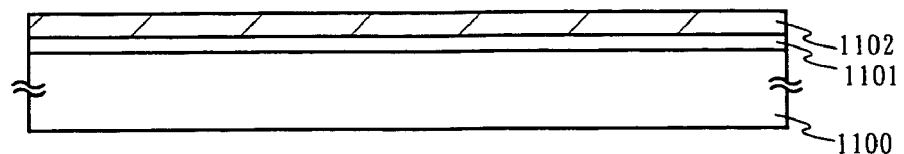
FIGS. 16A to 16D are diagrams illustrating a first embodiment.

Next, an amorphous silicon film 102 is formed 50 nm thick on the primary insulating film 1101 in accordance with the plasma CVD method. Here, in general, the silicon film, which is formed in accordance with the plasma CVD method, may contain hydrogen in many cases. A large amount of contained hydrogen significantly decreases the durability of the silicon film against laser. Therefore, thermal processing (at 500° C. in an atmosphere of nitrogen for one hour) is performed for the dehydrogenation. Notably, the dehydrogenation is performed by using thermal processing using a furnace here. However, the dehydrogenation may be performed by using a lamp anneal device (FIG. 16A).

Figure 16B:
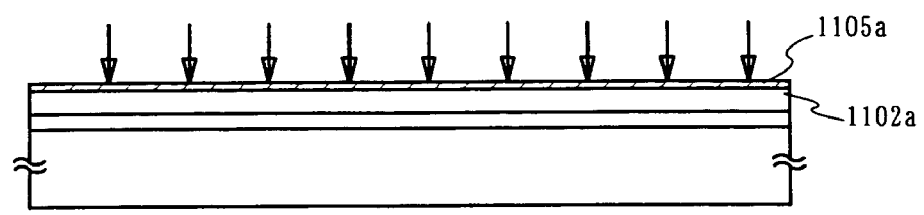
Figure 16C:
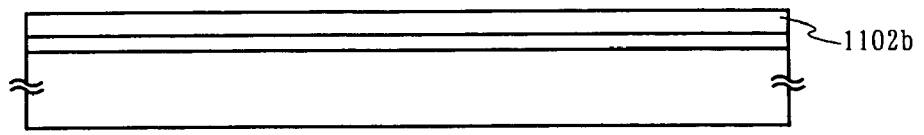
Figure 16D:
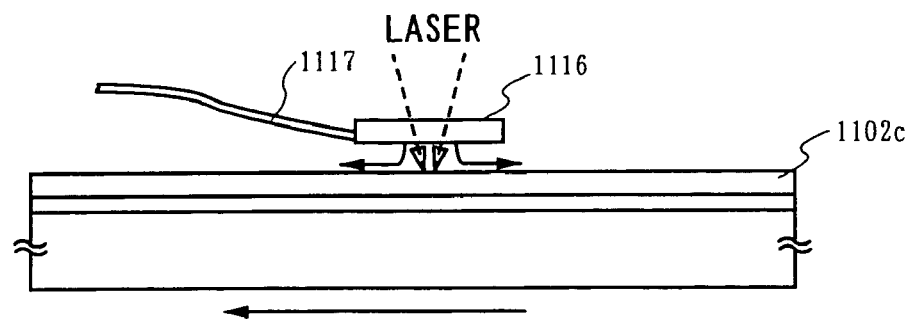

Next, laser light (XeCl: wave length of 308 nm) is irradiated in the air in order to crystallize the amorphous silicon film 1102. The laser light may be excimer laser light with wavelength of 400 nm or below, the second harmonic or the third harmonic of YAG laser. In either case, pulse laser light with repetition frequency of the order of 10 to 1000 Hz may be used. Then, the laser light is gathered into a rectangular form with an energy density of 100 to 500 mj/cm by using an optical system. The laser light may be irradiated with an overlap ratio of 90 to 95% and may scan the surface of the silicon film. Here, the laser light is irradiated in the air with the repetition frequency 30 Hz and the energy density of 476 $mj/cm^2$. The optical system for gathering laser light may be a triplet cylindrical lens 301 shown in FIG. 1, for example. The laser light is preferably gathered linearly because the efficiency of laser processing is increased. The triplet cylindrical lens is a lens constructed by three lenses in order to suppress spherical aberration. In the present invention, a singlet cylindrical lens (single lens construction) or a doublet cylindrical lens 319 shown in FIG. 3A may be used. In order to obtain beams with uniform energy distribution on the surface of the semiconductor film, lens with small spherical aberration is preferably used. Through this process, a silicon film 1102a having a crystalline structure is obtained. This process is performed in the air, an oxidized film 1105a is formed (FIG. 16B). The oxidized film 1105a is removed by an etchant such as hydrofluoric acid before the irradiation of the second laser light (FIG. 16C).

Next, a detail of a process of irradiating the second laser light to the silicon film 1102b, from which the oxidized film is removed, is shown with reference to FIG. 1. First of all, a substrate 305 (which corresponds to the substrate 1100 in FIG. 16A) on which a silicon film 1102b is formed is located on a stage 306. Then, nitrogen, for example, is supplied from a gas feed tube 302 to a plate 304 to which an inert gas is injected. Thus, the nitrogen is injected. The plate 304 held by a holding mechanism 307 is located immediately above the semiconductor film 102. The plate 304 is levitated above the semiconductor film by the injected nitrogen. The holding mechanism 307 is fixed completely to the plate 304, and there is a room where the plate 304 can levitate. The inert gas may be a noble gas. The use of hydrogen can suppress the reaction caused between oxygen and the semiconductor film.

With the plate 304 levitated, laser light is gathered linearly by the triplet cylindrical lens 301. Then the laser light is irradiated to the silicon film 1102 through a window 303 having transparency against laser light. Then, the stage 306 is moved in the direction indicated by arrows in FIG. 16D, that is in the direction perpendicular to the direction of the length of linear beams. Then, laser light is irradiated all over the silicon film 1102. A quartz window is preferably used for the window 303 because it has high transparency to laser light. Through this process, the atmosphere near the silicon film where the laser light is just irradiated is substantially turned to an atmosphere of nitrogen. Thus, it is preferable because the oxidation of the silicon film can be prevented, which reduced depressions and projections caused on the surface of the silicon film. Through the process, a crystalline silicon film 1102c can be obtained with significantly small depressions and projections on the surface.

This process is preferably used for the irradiation of the second laser light because the semiconductor properties can be raised and the depressions and projections caused on the surface of the silicon film can be reduced. However, when a semiconductor film with higher properties is not particularly required, the irradiation of the first laser light can be omitted and only the second laser light may be irradiated in order to reduce the depressions and projections formed on the surface of the semiconductor film. The reduction of the depressions and projections may contribute to the improvement of yield of the semiconductor apparatus. In this example, the laser light is irradiated to the amorphous silicon film. However, the laser light can be irradiated similarly to a crystalline silicon film having undergone a crystallization process of the silicon film by using the above-described metal element.

Second Embodiment

An example of a structure of a plate to which a gas is injected according to the present invention will be described with reference to FIGS. 2A and 2B.

Figure 2A:
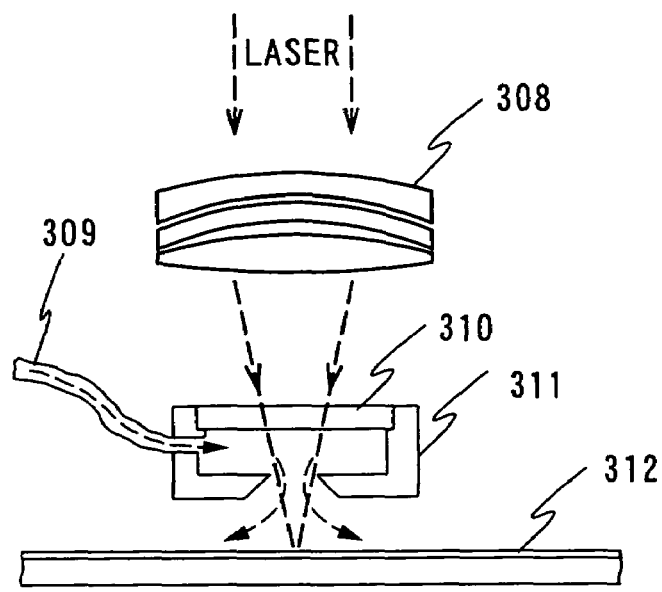
FIGS. 2A and 2B are diagrams illustrating a second embodiment.

An example of a plate to which a gas is injected is shown in FIG. 2A. An inert gas is supplied from a gas feed tube 309 to a plate including a quartz window 310 and an aluminum alloy 311. The inert gas is injected from a slit-like hole provided at the bottom of the aluminum alloy 311. Under this condition, the plate in provided immediately above the semiconductor film 312 and is levitated by pressure caused by the injection of the inert gas.

A holding mechanism, not shown in FIG. 2A, for fixing a position of the plate, like the holding mechanism 307 shown in FIG. 1, must be provided. Thus, the plate can be levitated with stability above the semiconductor film 102. In the shown example, a triplet cylindrical lens 308 is used for gathering laser light linearly. By using this, laser light is gathered to the semiconductor film 102 in order to obtain higher energy density.

The quartz window 310 is provided for allowing the laser light to be passed therethrough. The hole provided at the bottom of the aluminum alloy 311 functions both as an injecting opening of the inert gas and as a portion passing the laser light. The aluminum alloy is used in order to lighten the plate. Accordingly, other materials may be used for constructing the plate.

Figure 2B:
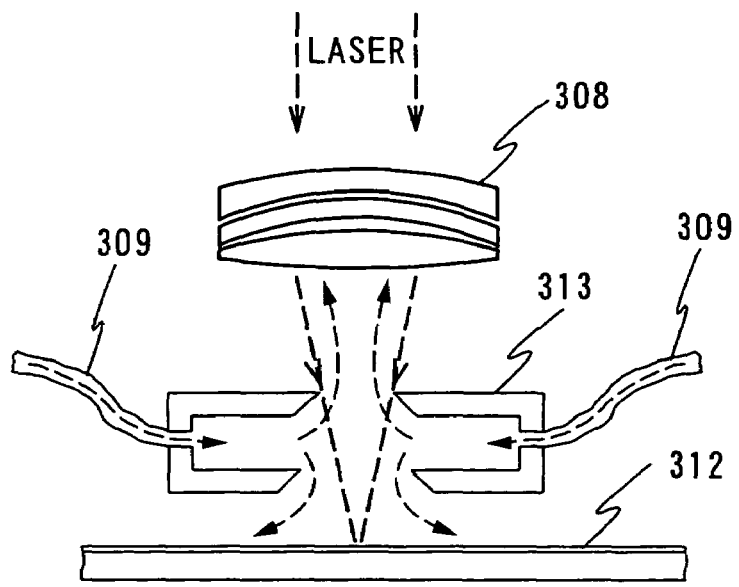

An example of another plate to which a gas is injected is shown in FIG. 2B. An inert gas, such as nitrogen, is supplied from the gas feed tube 309 to a plate including an aluminum alloy. The inert gas is injected from slit-like holes provided at the top and the bottom of the aluminum alloy 313. When the gas feed tubes 309 are provided at the right and the left of the plate, as shown in FIG. 2B, the construction can be vertically symmetrical. Thus, the gas can be supplied with more stability. This structure can be used for the one shown in FIG. 2A. Under this condition, the plate is provided immediately above the semiconductor film 312 and is levitated by pressure caused by the injection of nitrogen. Since the slit-like holes are provided at the top and the bottom of the plate, nitrogen is injected from the top and bottom slit-like holes of the plate. Nitrogen injected toward the bottom of the plate is used to levitate the plate. Nitrogen injected toward the top of the plate can prevent dust from adhering to an optical element provided above the plate, that is, the triplet cylindrical lens 308 to which nitrogen is blown.

A holding mechanism, not shown in FIG. 2B, for fixing a position of the plate, like the holding mechanism 307 shown in FIG. 1, must be provided. Thus, the plate can be levitated with stability above the semiconductor film 102. In the shown example, the triplet cylindrical lens 308 is used for gathering laser light linearly. By using this, laser light is gathered to the semiconductor film 102 in order to obtain higher energy density.

In the example in FIG. 2B, the slit-like holes are provided at the top and the bottom of the plate. Thus, laser light only needs to pass through both slit-like holes. The aluminum alloy is used in order to lighten the plate. Accordingly, other materials may be used for constructing the plate.

Third Embodiment

An example where the present invention is implemented in mass production processes will be described with reference to FIGS. 3A and 3B. A laser oscillator 314 may be LAMBDA 4308B, for example. The laser has a capability to emit energy of 670 mj per pulse, and therefore can be long, linear beams of the order of 300 mm by using a proper optical system.

An optical system 315 for forming linear beams will be described. The optical system 315 has a homogenizer mechanism for obtaining linear beam having uniform energy distribution in the irradiated surface. An optical element 316 makes energy distribution uniform in the shorter width direction of linear beams by combining a cylindrical lens array and a cylindrical lens. As shown in FIG. 3A, two cylindrical lens arrays may be used to make the length of the shorter width of the linear beams variable. In order to change the length, a distance between the cylindrical array may be changed. An optical element 317 makes the energy distribution uniform in the direction of longer width of the linear beams by similarly combining a cylindrical lens array and a cylindrical lens. A top view of the optical element 317 is shown in FIG. 3B. While one cylindrical lens array is shown, two cylindrical lenses can be used to make the length of the longer width of linear beams variable. A mirror 318 functions to bend laser light, which travels in the horizontal direction, to the vertical direction. Thus, linear beams can be formed into a horizontal plane so that a semiconductor film to be irradiated can be provided horizontally. The shorter width of linear beams may be further shortened through the doublet cylindrical lens 319 such that higher energy density can be obtained on the irradiated surface. As a result, the length of the linear beams can be longer, and therefore laser light can be irradiated on a large area substrate. In order to divide an atmosphere surrounding a semiconductor film to which laser is irradiated and an atmosphere surrounding the optical system 315, the optical system 315 may be surrounded by a divider, and a quarts window 320 through which laser light can pass may be provided thereto. For example, the optical system 315 may be prevented from being deteriorated by performing nitrogen purging on the optical system 315 in this embodiment.

Next, a process of irradiating laser light on a semiconductor film will be described. A substrate 324 is located on a stage 325 by using a robot arm, not shown, for example. Then, nitrogen is supplied by a gas feed device 322 connected to a nitrogen cylinder 326 to a plate 323 to which a gas is injected. Thus, a proper amount of nitrogen can be injected from the plate. Then, the plate 323 is located directly above the semiconductor film and is levitated above the semiconductor film by the injection of nitrogen. A nitrogen gas can cover a shortfall of laser energy when heated by a heating device 327. Under this condition, laser light is irradiated, and, at the same time, the stage 325 is moved in the direction perpendicular to the longer width direction of the linear beams. Then, laser light is irradiated to the semiconductor film. A laser oscillator 314 is controlled by a controller 321 to input oscillating energy and/or frequency. Before the substrate 324 is located on the stage 325, the plate to which a gas is injected is preferably connected to a proper operational mechanism so as to wait at a proper place. Thus, the possibility of causing interference between the substrate and the plate is decreased. By repeating the series of operations, a number of semiconductor films can be processed by laser.

Fourth Embodiment

In this embodiment, a method of manufacturing an active matrix substrate will be described with reference to FIGS. 7A to 10. A substrate on which a CMOS circuit, a drive circuit, and a pixel portion having a TFT pixel and a holding capacity are formed together is called active matrix substrate for convenience.

First of all, a substrate 400 formed of glass such as barium borosilicate glass and aluminum borosilicate glass, which is typically Corning #7059 glass and #1737 glass, is used in this example. The substrate 400 may be a quartz substrate, a silicon substrate or a metal substrate or stainless substrate, which has an insulating film on the surface. The substrate 400 may be a plastic substrate having heat resistance, which withstands a processing temperature in this embodiment.

Next, a primary film 401 having an insulating film such as silicon oxide film, silicon nitride film, and a silicon oxide nitride film is formed on the substrate 400. In this embodiment, a two-layer structure is used for the primary film 401. However, a structure may be used where a single layer film, which is the insulating film itself, or at least two layers are stacked. As a first layer of the primary film 401, a silicon oxide nitride film 401a is formed 10 to 200 nm (preferably 50 to 100 nm) thick by using $SiH_4$, $NH_3$ and $N_2O$ as a reaction gas in accordance with the plasma CVD method. In this example, a silicon oxide nitride film 401a (compositional ratio: Si=32%, O=27%, N=24% and H=17%) was formed 50 nm thick. Next, as a second layer of the primary film 401, a silicon oxide nitride film 401b is formed 50 to 200 nm (preferably 100 to 150 nm) thick by using $SiH_4$ and $N_2O$ as a reaction gas in accordance with the plasma CVD method. In this example, a silicon oxide nitride film 401b (compositional ratio: Si=32%, O=59%, N=7% and H=2%) is formed 100 nm thick.

Next, semiconductor layers 402 to 406 are formed on the primary film. First of all, semiconductor film is formed 25 to 80 nm thick (preferably 30 to 60 nm) by a publicly known method (such as the sputtering method, LPCVD method and plasma CVD method). Then, the semiconductor film is crystallized by a publicly known method (such as laser crystallization method, thermal crystallization method using RTA or a furnace annealing and thermal crystallization method using a metal element facilitating the crystallization). Patterning is performed on the obtained crystalline semiconductor film in a desired form in order to form the semiconductor layers 402 to 406. The semiconductor film may be an amorphous semiconductor film, a fine crystal semiconductor film or a crystalline semiconductor film. Alternatively, the semiconductor film may be a compound semiconductor film having an amorphous structure such as an amorphous silicon germanium film. In this example, plasma CVD method is used to form an amorphous silicon film 55 nm thick. Solution containing nickel is held on the amorphous silicon film. After the dehydrogenation is performed on the amorphous silicon film (at 500° C. for one hour), thermal crystallization (at 550° C. for four hours) is performed thereon. Then, laser light is irradiated to form a crystalline silicon film. The semiconductor layers 402 to 406 are formed by performing patterning processing thereon by using the photolithography method.

When a crystalline semiconductor film is produced in accordance with the laser crystallization method, the pulse type or the continuous light-emitting type of excimer laser, YAG laser, $YVO_4$ laser, YLF laser, $YAlO_3$ laser, glass laser, ruby laser or Ti: sapphire laser may be applied. When these types of laser are used, a method is preferable whereby laser light emitted from a laser oscillator is gathered by an optical system and is irradiated to a semiconductor film. The condition of the crystallization may be selected by the practitioner as necessary. However, when excimer laser is used, the pulse frequency is 300 Hz and the laser energy density is 100 to 700 mj/cm² (typically 200 to 300 mj/cm²). Preferably, when YAG laser is used, the second harmonic is used, and the pulse frequency is 1 to 300 Hz. The laser energy density is preferably 300 to 1000 mj/cm² (typically 350 to 500 mj/cm²). Then, laser light gathered linearly of 100 to 1000 µm wide, or 400 µm wide in this embodiment, is irradiated all over the surface of the substrate. The overlap percentage of the linear beams may be 50 to 98%.

In order to obtain large grain size of crystals at the time of the crystallization of the amorphous semiconductor film, solid laser, which allows continuous oscillation, is used. Then, one of second to fourth harmonics of the basic wave is preferably applied. Typically, the second harmonic (532 nm) and/or the third harmonic (355 nm) of the Nd:$YVO_4$ laser (basic wave 1064 nm) may be applied. When continuous wave laser is applied, laser light emitted from continuous wave $YVO_4$ laser having 10 W output is converted to a harmonic by a nonlinear optical element. Alternatively, $YVO_4$ crystals and the nonlinear optical element may be put into a resonator such that a harmonic can be emitted. Preferably, laser light in a rectangular or oval form is formed on the irradiated surface by an optical system, and the formed laser light is irradiated to a subject. The energy density thereof must be the order of 0.01 to 100 MW/cm² (preferably 0.1 to 10 MW/cm²). The semiconductor film may be moved with respect to laser light at a speed of the order of 10 to 2000 cm/s for the irradiation of the laser light.

The amorphous silicon film is crystallized by using a metal element facilitating the crystallization in this example. Therefore, the metal element remains the crystalline silicon film. The metal element is removed as follows: First of all, an amorphous silicon film 50 to 100 nm thick is formed on the crystalline silicon film. Then, thermal processing (such as RTA method or thermal annealing using an annealing furnace) is performed thereon. Then, the metal element is diffused in the amorphous silicon film, and the amorphous silicon is removed by etching after heating processing. Thus, the metal element contained in the crystalline silicon film can be reduced or removed.

In this example, the technology is used whereby thermal crystallization is performed by using nickel as a metal element facilitating the crystallization of silicon and then pulse laser light is irradiated. However, an amorphous silicon film may be crystallized by continuous wave laser (the second harmonic of YVO$_4$ laser) without adding nickel thereto.

After the semiconductor layers 402 to 406 are formed, a small amount of impurity element (boron or phosphorus) may be doped in order to control a threshold value of the TFT.

Next, a gate insulating film 407 covering the semiconductor layers 402 to 406 is formed. The gate insulating film 407 is formed by using an insulating film 40 to 150 nm thick containing silicon in accordance with plasma CVD method or sputtering method. In this embodiment, a silicon oxide nitride film (compositional ratio: Si=32%, O=59%, N 20=7% and H=2%) 110 nm thick is formed in accordance with the plasma CVD method. Notably, the gate insulating film is not limited to the silicon oxide nitride film but an insulating film containing other silicon may be used as a single layer or as a laminated pad.

When a silicon oxide film is used, it is formed by mixing Tetraethyl Orthosilicate (TEOS) and O$_2$ by plasma CVD method, which is discharged under a condition with reaction pressure of 40 Pa, a substrate temperature of 300 to 400° C. and high frequency (13.56 MHz) power density of 0.5 to 0.8 W/cm$^2$. Thermal annealing at 400 to 500° C. thereafter can give good characteristics to the silicon oxide film produced in this way as a gate insulating film.

Next, a first conductive film 408, which is 20 to 100 nm thick, and a second conductive film 409, which is 100 to 400 nm thick, is stacked on the gate insulating film 407. In this embodiment, the first conductive film 408 formed by a TaN film 30 nm thick and the second conductive film 409 formed by a W film 370 nm thick are stacked. The TaN film is formed by using Ta target to perform sputtering in an atmosphere containing nitrogen. The W film is formed by using W target to perform sputtering. Alternatively, it can be formed by thermal CVD method using 6 tungsten fluoride (WF$_6$). In both cases, the use of the gate electrode needs low resistance. Therefore, the resistivity of the W film is desirably 20 μΩcm or below. The low resistance of the W film can be achieved by increasing the size of the crystal grains. However, when the W film contains a large amount of impurity element such as oxygen, the crystallization is inhibited, which raises the resistance. Accordingly, in this embodiment, the W film is formed by the sputtering method using high purity (purity of 99.9999%) W target and by taking the prevention of intrusion of impurity from a vapor phase during the film forming into special consideration. Thus, the resistivity of 9 to 20 μΩcm can be achieved.

While, in this embodiment, the first conductive film 408 is TaN and the second conductive film 409 is W, they are not limited in particular. Both of them can be formed by an element selected from Ta, W, Ti, Mo, Al, Cu, Cr and Nd or an alloy material or a compound material mainly containing the element. Alternatively, a semiconductor film, such as a polycrystalline silicon film to which an impurity element such as phosphorus is doped, can be used. An AgPdCu alloy may be used. A combination of the first conductive film formed by a tantalum (Ta) film and the second conductive film formed by a W film, a combination of the first conductive film formed by a titan nitride (TiN) and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Figures 7A, 7B, 7C:
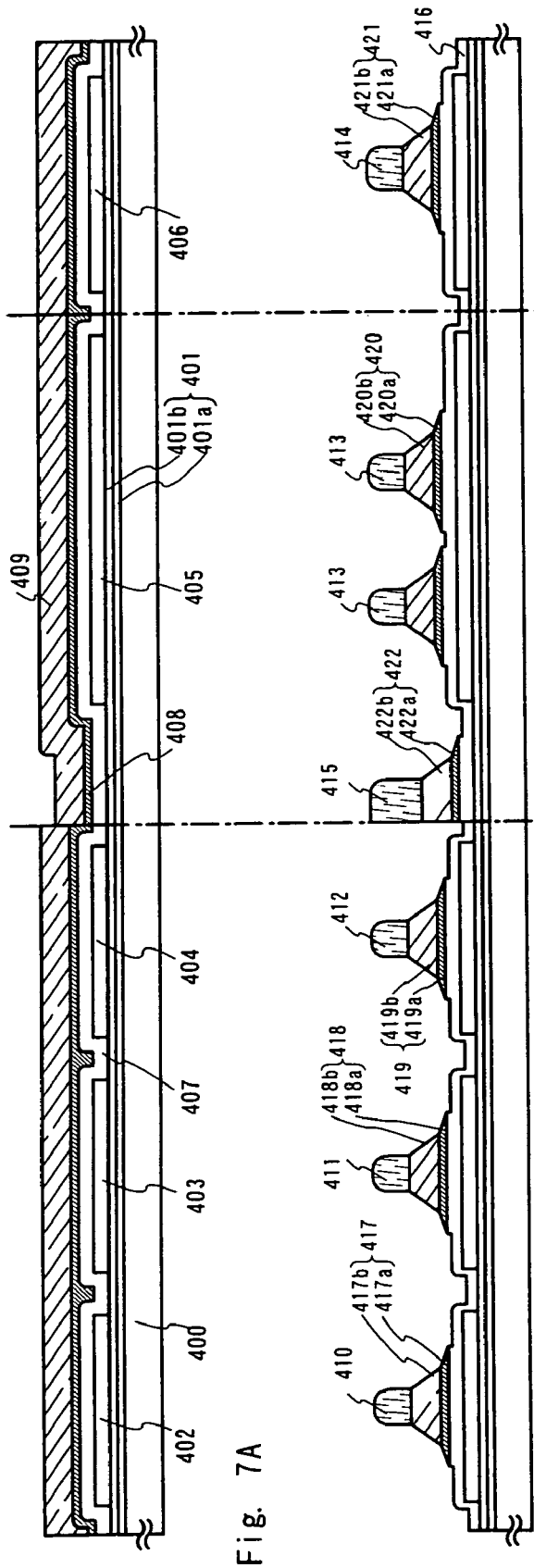
FIGS. 7A to 7C are sectional views illustrating an example of a process of manufacturing a thin film transistor.

Next, resist masks 410 to 415 using photolithography method are formed, and first etching processing is performed thereon in order to form electrodes and wires. The first etching processing is performed under first and second etching conditions (FIG. 7B). The first etching condition in this example is to use Inductively Coupled Plasma (ICP) etching and to use CF$_4$ and Cl$_2$ and O$_2$ as an etching gas, whose amount of gases are 25/25/10 (sccm), respectively. 500 W of RF (13.56 MHz) power was supplied to a coil type electrode by 1 Pa pressure in order to generate plasma and then to perform etching. Here, a dry etching device using ICP (Model E645-□ICP) manufactured by Matsushita Electric Industrial Co., Ltd was used. 150 W of RF (13.56 MHz) power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the resist masks 410 to 415. Then, CF$_4$ and Cl$_2$ are used as etching gases. The ratio of the amounts of flowing gasses is 30/30 (sccm). 500 W of RF (13.56 MHz) power is supplied to a coil type electrode by 1 Pa pressure in order to generate plasma and then to perform etching for amount 30 seconds. 20 W of RF (13.56 MHz) power is also supplied to a substrate side (test sample stage) and substantially negative self-bias voltage is applied. Under the second etching condition where CF$_4$ and Cl$_2$ are mixed, both W film and TaN film were etched to the same degree. In order to etch without leaving a residue on the gate insulating film, the etching time may be increased 10 to 20% more.

In the first etching processing, when the form of the resist mask is appropriate, the form of the ends of the first and the second conductive layers are in the tapered form due to the effect of the bias voltage applied to the substrate side. The angle of the tapered portion is 15 to 45°. Thus, conductive layers 417 to 422 in a first form are formed which include the first conductive layers and the second conductive layers (first conductive layers 417a to 422a and second conductive layer 417b to 422b) through the first etching processing. In a gate insulating film 416, an area not covered by the first conductive layers 417 to 422 is etched by about 20 to 50 nm so as to form a thinner area.

Next, second etching processing is performed without removing resist masks (FIG. 7C). Here, CF$_4$, Cl$_2$ and O$_2$ are used to etch the W film selectively. Then, second conductive layers 428b to 433b are formed by the second etching processing. On the other hand, the first conductive layers 417a to 422a are not etched very much, and conductive layers 428 to 433 in the second form are formed.

First doping processing is performed without removing resist masks and low density of impurity element, which gives n-type to the semiconductor layer, is added. The doping processing may be performed in accordance with the ion-doping method or the ion-implanting method. The ion doping method is performed under a condition in the dose of $1 \times 10^{13}$ to $5 \times 10^{14}$/cm$^2$ and the accelerating voltage of 40 to 80 keV. In this embodiment, the ion doping method is performed under a condition in the dose of $1.5 \times 10^{13}$/cm$^2$ and the accelerating voltage of 60 keV. The n-type doping impurity element may be Group 15 elements, typically phosphorus (P) or arsenic (As). Here, phosphorus (P) is used. In this case, the conductive layers 428 to 433 function as masks for the n-type doping impurity element. Therefore, impurity areas 423 to 427 are formed in the self-alignment manner. An n-type doping impurity element in the density range of $1 \times 10^{18}$ to $1 \times 10^{20}$/cm$^3$ are added to the impurity areas 423 to 427.

When resist masks are removed, new resist masks 434a to 434c are formed. Then, second doping processing is performed by using higher accelerating voltage than that used in the first doping processing. The ion doping method is performed under a condition in is the dose of $1\times10^{13}$ to $1\times10^{15}$/cm$^2$ and the accelerating voltage of 60 to 120 keV. In the doping processing, the second conductive layers 428b to 432b are used as masks against the impurity element. Doping is performed such that the impurity element can be added to the semiconductor layer at the bottom of the tapered portion of the first conductive layer. Then, third doping processing is performed by having lower accelerating voltage than that in the second doping processing to obtain a condition shown in FIG. 8A. The ion doping method is performed under a condition in the dose of $1\times10^{15}$ to $1\times10^{17}$/cm$^2$ and the accelerating voltage of 50 to 100 keV. Through the second doping processing and the third doping processing, an n-type doping impurity element in the density range of $1\times10^{18}$ to $5\times10^{19}$/cm$^3$ is added to the low density impurity areas 436, 442 and 448, which overlap with the first conductive layer. An n-type doping impurity element in the density range of $1\times10^{19}$ to $5\times10^{21}$/cm$^3$ is added to the high density impurity areas 435, 441, 444 and 447.

With proper accelerating voltage, the low density impurity area and the high density impurity area can be formed by performing the second doping processing and the third doping processing once.

Next, after removing resist masks, new resist masks 450a to 450c are formed to perform the fourth doping processing. Through the fourth doping processing, impurity areas 453, 454, 459 and 460, to which an impurity element doping a conductive type opposite to the one conductive type is added, in a semiconductor layer, which is an active layer of a P-channel type TFT. Second conductive layers 428a to 432a are used as mask against the impurity element, and the impurity element giving p-type is added so as to form impurity areas in the self-alignment manner. In this example, the impurity areas 453, 454 456, 459 and 460 are formed by applying ion-doping method using diborane (B$_2$H$_6$) (FIG. 8B). During the fourth doping processing, the semiconductor layer forming the n-channel TFT is covered by resist masks 450a to 450c. Thorough the first to the third doping processing, phosphorus of different densities is added to each of the impurity areas 435 and 439. Doping processing is performed such that the density of p-type doping impurity element can be $1\times10^{19}$ to $5\times10^{21}$ atoms/cm$^3$ in both areas. Thus, no problems are caused when they function as the source region and the drain region of the p-channel TFT.

Impurity areas are formed in the semiconductor layers, respectively, through the processes above.

Next, the resist masks 450a to 450c are removed and a first interlayer insulating film 461 is formed thereon. The first interlayer insulating film 461 may be an insulating film 100 to 200 nm thick containing silicon, which is formed by plasma CVD method or sputtering method. In this example, silicon oxide nitride 150 nm thick is formed by plasma CVD method. The first interlayer insulating film 461 is not limited to the silicon oxide nitride film but may be the other insulating film containing silicon in a single layer or in a laminated pad.

Next, as shown in FIG. 8C, thermal processing is performed to recover the crystalline characteristic of the semiconductor layers and to activate the impurity element added to each of the semiconductor layer. The heating processing is performed by thermal annealing method using an annealing furnace. The thermal annealing method may be performed in an atmosphere of nitrogen with the oxygen density of 1 ppm or below, preferably 0.1 ppm or below, at 400 to 700° C., typically at 500 to 550° C. In this embodiment, the activation processing is performed through thermal processing at 550° C. for four hours. In addition to the thermal annealing method, laser annealing method or rapid thermal annealing method (RTA method) may be applied.

Alternatively, the heating processing may be performed before the first interlayer insulating film is formed. However, when a wiring material in use is sensitive to heat, the activation processing is preferably performed after an inter-layer insulating film (insulating film mainly containing silicon such as silicon nitride film) for protecting the wires like this embodiment.

After the heating processing (thermal processing at 300 to 550° C. for one to 12 hours) is performed, hydrogenation can be performed. This process terminates the dangling bond of the semiconductor layer with hydrogen contained in the first interlayer insulating film 461. The semiconductor layer can be hydrogenated regardless of the existence of the first interlayer insulating film. Alternatively, the hydrogenation may be plasma hydrogenation (using hydrogen excited by plasma) or heating processing in an atmosphere containing 3 to 100% of hydrogen at 300 to 450° C. for 1 to 12 hours.

When laser annealing method is used for the activation processing, laser light such as excimer laser and YAG laser is desirably irradiated after the hydrogenation is performed.

Next, a second interlayer insulating film 462 formed by a non-organic insulating material or an organic insulating material is formed on the first interlayer insulating film 461. In this embodiment, an acrylic resin film 1.6 μm thick is formed, whose viscosity is 10 to 1000 cp, preferably 40 to 200 cp and which has depressions and projections formed on the surface.

In this embodiment, in order to prevent mirror reflection, a second interlayer insulating film having projections and depressions on the surface is formed. Thus, the projections and depressions are formed on the surface of the pixel electrode. In order to obtain an effect of light dispersion by forming the depressions and projections on the surface of the pixel electrode, a projecting portion may be formed under the pixel electrode. In this case, the projecting portion can be formed by using the same mask for forming a TFT. Thus, the projecting portion can be formed without any increase in the number of steps. The projecting portion may be provided as necessary on the substrate in the pixel area except for wires and the TFT portion. Accordingly, projections and depressions can be formed on the surface of the pixel electrode along the projections and depressions formed on the surface of an insulating film covering the projecting portion.

Alternatively, the second interlayer insulating film 462 may be a film having a flattened surface. In this case, after the pixel electrode is formed, projections and depressions are formed on the surface by performing an added process such as publicly known sand-blast method and etching method. Preferably, by preventing mirror reflection and by dispersing reflected light, the whiteness is increased.

Figure 9:
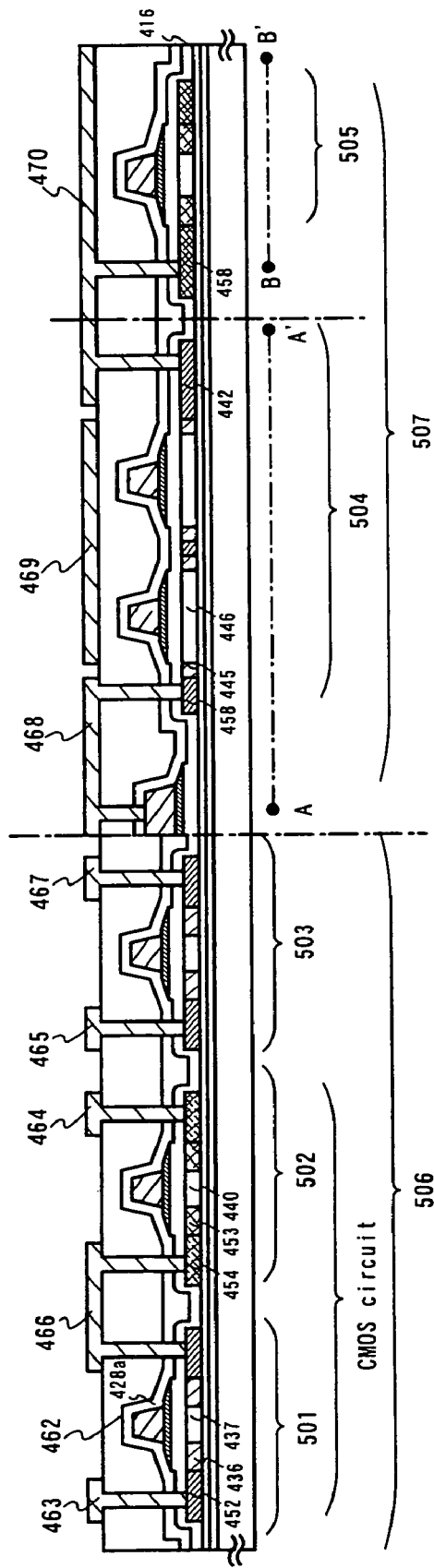
FIG. 9 is a sectional view illustrating the example of a process of manufacturing the thin film transistor.

Wires 463 to 467 electrically connecting to impurity areas, respectively, are formed in a drive circuit 506. These wires are formed by patterning a film laminating a Ti film 50 nm thick and an alloy film (alloy film of Al and Ti) 500 nm thick. It is not limited to the two-layer structure but may be a one-layer structure or a laminate pad including three or more layers. The materials of the wires are not limited to Al and Ti. For example, the wire can be formed by forming Al or Cu on a TaN film and then by patterning the laminate film in which a Ti film is formed (FIG. 9).

In a pixel portion 507, a pixel electrode 470, a gate wire 469 and a connecting electrode 468 are formed. Source wires (a laminate of layers 443a and 443b) are electrically connected with a TFT pixel by the connecting electrode 468. The gate wire 469 is electrically connected with a gate electrode of the TFT pixel. A pixel electrode 470 is electrically connected with a drain region 442 of the TFT pixel. Furthermore, the pixel electrode 470 is electrically connected with a semiconductor layer 458 functioning as one electrode forming a holding capacity. Desirably, a material having excellent reflectivity such as a film mainly containing Al or Ag or the laminate film is used for the pixel electrode 470.

In this way, the drive circuit 506 having a CMOS circuit including an n-channel TFT 501 and a p-channel TFT 502 and a n-channel TFT 503, and the pixel portion 507 having the TFT pixel 504 and the storage capacitor 505 can be formed on the same substrate. Thus, an active matrix substrate is completed.

The n-channel TFT 501 of the drive circuit 506 has a channel formed area 437, a low density impurity area 436 overlapping with the first conductive layer 428a, which constructs a part of the gate electrode, (GOLD area) and a high density impurity area 452 functioning as the source region or the drain region are implanted. The p-type channel TFT 502 forming a CMOS circuit together with the n-channel TFT 501, which are connected by an electrode 466, has a channel formed area 440, a high density impurity area 454 functioning as the source region or the drain region, and an impurity area 453 to which an n-type doping impurity element and a p-type doping impurity element are implanted. The n-channel TFT 503 has a channel formed area 443, a low density impurity area 442 overlapping with the first conductive layer 430a, which constructs a part of the gate electrode, (GOLD area), a high density impurity area 456 functioning as the source region or the drain region, and an impurity area 455 to which an n-type doping impurity element and a p-type doping impurity element are implanted.

The TFT pixel 504 of the pixel portion has a channel formed area 446, a low density impurity area 445 formed outside of the gate electrode (LDD region) and a high density impurity area 458 functioning as the source region or the drain region are implanted. An n-type doping impurity element and a p-type doping impurity element are added to a semiconductor layer functioning as one electrode of the storage capacitor 505. The storage capacitor 505 is formed by an electrode (a laminate of layers 432a and 432b) and a semiconductor layer by using the insulating film 416 as a dielectric.

The pixel structure in this example is arranged such that light can be blocked in a space between pixel electrodes and the ends of the pixel electrodes can overlap with the source wire without using the black matrix.

Figure 10:
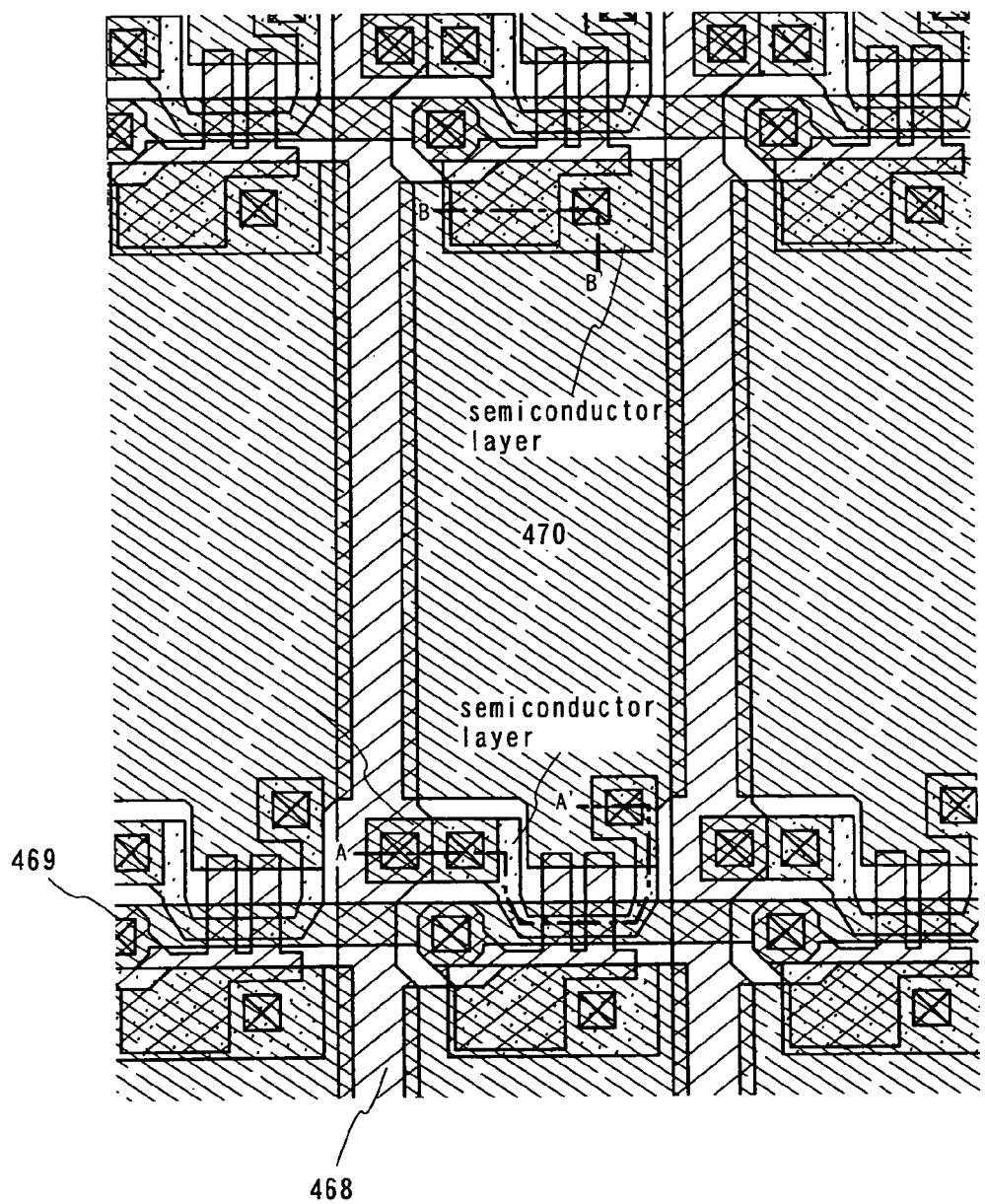
FIG. 10 is a top view illustrating the example of a process of manufacturing the thin film transistor.

FIG. 10 shows a top view of the pixel portion of the active matrix substrate produced in this embodiment. The same reference numerals are used for the corresponding parts in FIGS. 7 to 10. A broken line A-A' in FIG. 9 corresponds to a sectional view taken along a broken line A-A' in FIG. 10. A broken line B-B' in FIG. 9 corresponds to a sectional view taken along a broken line B-B' in FIG. 10.

It should be noted that this example can be combined with any one of embodiments 1 to 3 freely.

Fifth Embodiment

Figure 11:
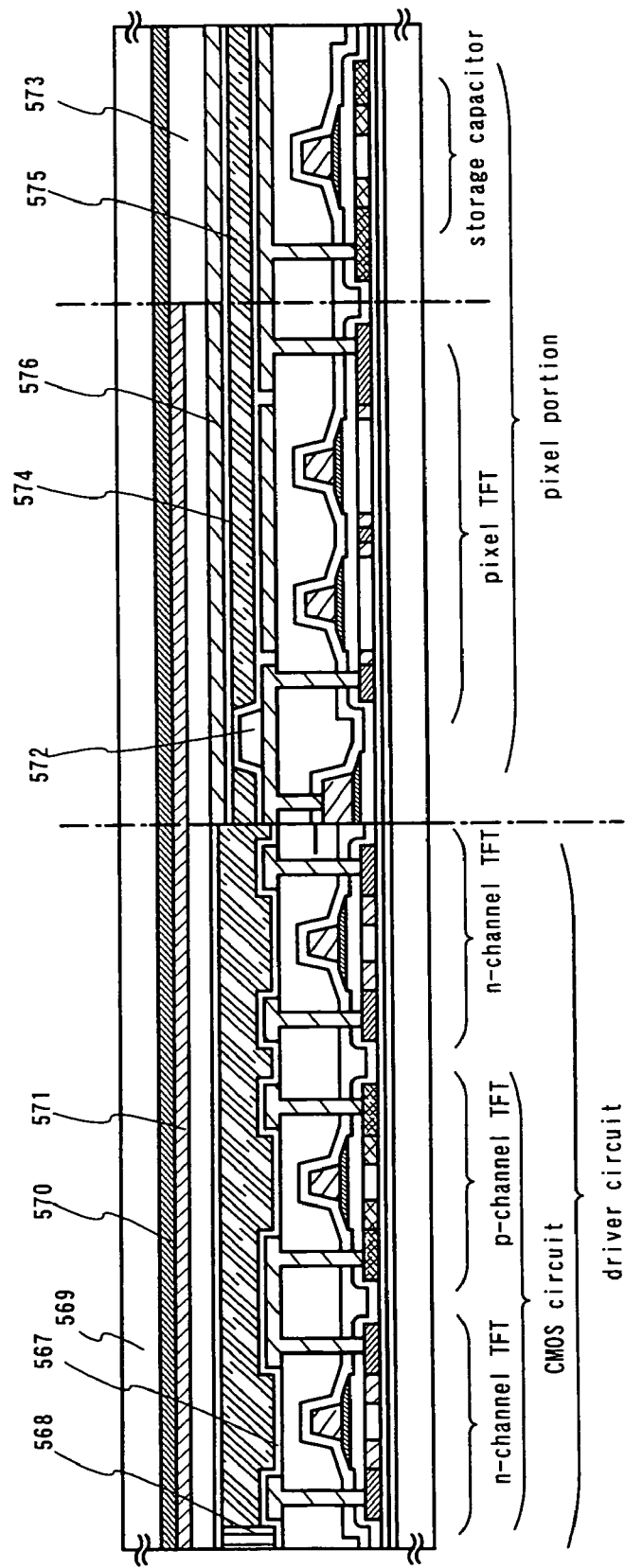
FIG. 11 is a diagram illustrating a sectional view of a liquid crystal display device.

This embodiment explains, below, a process to manufacture a reflection type liquid crystal display device from the active matrix substrate made in the fourth embodiment, using FIG. 11.

First, after obtaining an active matrix substrate in the state of FIG. 9 according to the fourth embodiment, an orientation film 567 is formed at least on the pixel electrodes 470 on the active matrix substrate of FIG. 9 and subjected to a rubbing process. Incidentally, in this embodiment, prior to forming an orientation film 567, an organic resin film such as an acryl resin film is patterned to form columnar spacers 572 in a desired position to support the substrates with spacing. Meanwhile, spherical spacers, in place of the columnar spacers, may be distributed over the entire surface of the substrate.

Then, a counter substrate 569 is prepared. Then, a coloring layer 570, 571 and a planarizing film 573 are formed on a counter substrate 569. A shade portion is formed by overlapping a red coloring layer 570 and a blue coloring layer 572 together. Meanwhile, the shade portion may be formed by partly overlapping a red coloring layer and a green coloring layer.

In this example is used a substrate shown in the fourth embodiment. Accordingly, in FIG. 10 showing a top view of the pixel portion of the fourth embodiment, there is a need to shade at least the gap between the gate wiring 469 and the pixel electrode 470, the gap between the gate wiring 469 and the connecting electrode 468 and the gap between the connecting electrode 468 and the pixel electrode 470. In this embodiment were bonded together the substrates by arranging the coloring layers so that the shading portion having a lamination of coloring layers is overlapped with the to-be-shading portion.

In this manner, the gaps between the pixels are shaded by the shading portion having a lamination of coloring layers without forming a shading layer such as a black mask, thereby enabling to reduce the number of processes.

Then, a counter electrode 576 of a transparent conductive film is formed on the planarizing film 573 at least in the pixel portion. An orientation film 574 is formed over the entire surface of the counter substrate and subjected to a rubbing process.

Then, the active matrix substrate formed with the pixel portion and driver circuit and the counter substrate are bonded together by a seal member 568. The seal member 568 is mixed with filler so that the filler and the columnar spacers bond together the two substrates through an even spacing. Thereafter, a liquid crystal material 575 is poured between the substrates, and completely sealed by a sealant (not shown). The liquid crystal material 575 may be a known liquid crystal material. In this manner, completed is a reflection type liquid crystal display device shown in FIG. 11. If necessary, the active matrix substrate or counter substrate is divided into a desired shape. Furthermore, a polarizing plate (not shown) is bonded only on the counter substrate. Then, an FPC is bonded by a known technique.

The liquid crystal display panel manufactured as above can be used as a display portion for an electronic appliance in various kinds.

Incidentally, this embodiment can be freely combined with the embodiments 1 to 4.

Sixth Embodiment

This embodiment explains an example of a light-emitting device manufactured by using the present invention. In this specification, the light-emitting device refers, generally, to the display panel having light-emitting elements formed on a substrate sealed between the substrate and a cover member, and the display module having an IC mounted on the display panel. Incidentally, the light emitting element has a layer including an organic compound that electroluminescence caused is obtained by applying an electric field (light-emitting layer), an anode and a cathode. Meanwhile, the electroluminescence in organic compound includes the light emission (fluorescent light) upon returning from the singlet-excited state to the ground state and the light emission (phosphorous light) upon returning from the triplet-excited state to the ground state, including any or both of light emission.

Figure 12:
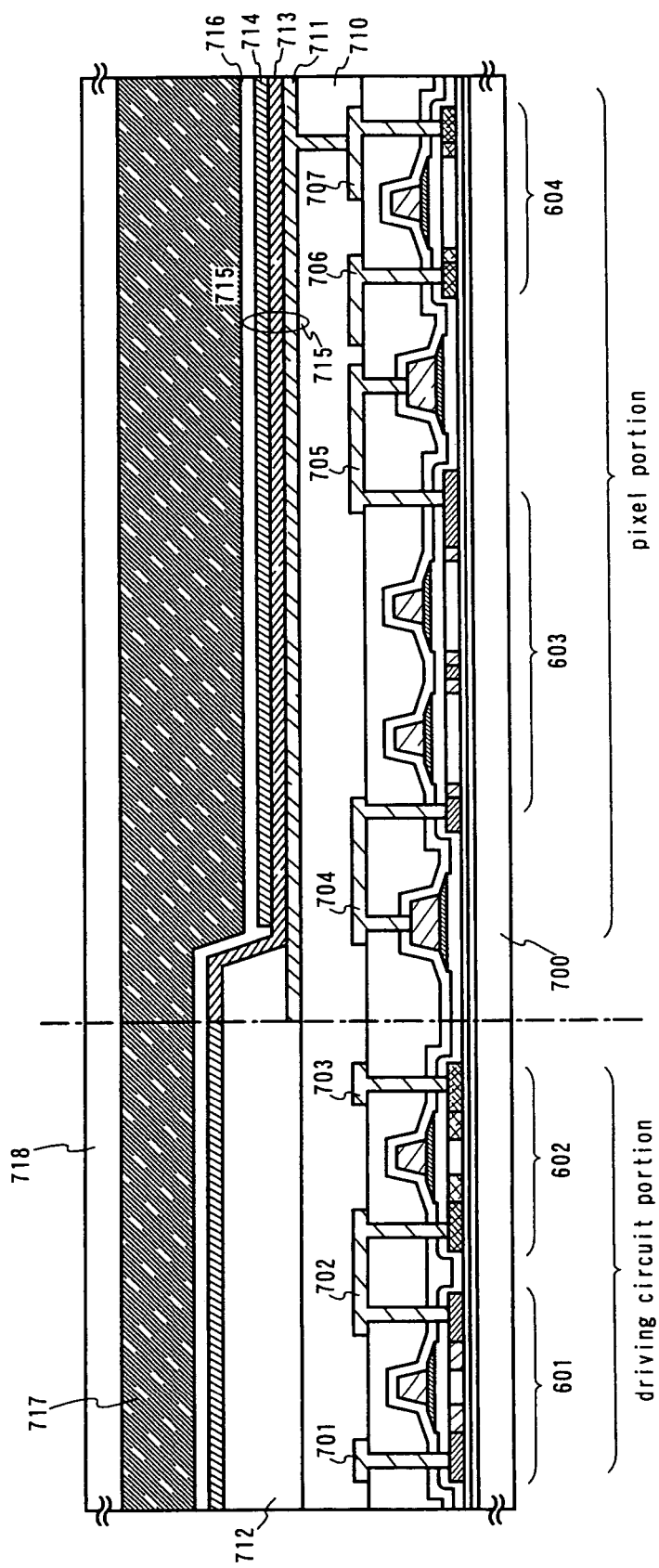
FIG. 12 is a sectional view of an electroluminescence module.

FIG. 12 is a sectional view of a light-emitting device of this embodiment. In FIG. 12, the switching TFT 603 provided on the substrate 700 is formed by using the n-channel TFT 503 of FIG. 9. Consequently, concerning the explanation of the structure, it is satisfactory to refer the explanation on the n-channel TFT 503.

Incidentally, although this example is of a double gate structure formed with two channel regions, it is possible to use a single gate structure formed with one channel region or a triple gate structure formed with three.

The driver circuit provided on the substrate 700 is formed by using the CMOS circuit of FIG. 9. Consequently, concerning the explanation of the structure, it is satisfactory to refer the explanation on the n-channel TFT 501 and p-channel TFT 502. Incidentally, although this embodiment is of a single gate structure, it is possible to use a double gate structure or a triple gate structure.

Meanwhile, the wirings 701, 703 serve as source wirings of the CMOS circuit while the wiring 702 as a drain wiring. Meanwhile, a wiring 704 serves as a wiring to electrically connect between the source wiring 708 and the source region of the switching TFT while the wiring 705 serves as a wiring to electrically connect between the drain wiring 709 and the drain region of the switching TFT.

Incidentally, a current control TFT 604 is formed by using the p-channel TFT 502 of FIG. 9. Consequently, concerning the explanation of the structure, it is satisfactory to refer to the explanation on the n-channel TFT 502. Incidentally, although this embodiment is of a single gate structure, it is possible to use a double gate structure or a triple gate structure.

Meanwhile, the wiring 706 is a source wiring of the current control TFT (corresponding to a current supply line) while the wiring 707 is an electrode to be electrically connected to the pixel electrode 711 by being overlaid a pixel electrode 711 of the current control TFT.

Meanwhile, 711 is a pixel electrode (anode of a light-emitting element) formed by a transparent conductive film. As the transparent conductive film can be used a compound of indium oxide and tin oxide, a compound of indium oxide and zinc oxide, zinc oxide, tin oxide or indium oxide, or otherwise may be used a transparent conductive film as above added with gallium. The pixel electrode 711 is formed on a planar interlayer insulating film 710 prior to forming the wirings. In this embodiment, it is very important to planarize the step due to the TFT by using a resin planarizing film 710. A light-emitting layer to be formed later, because being extremely small in thickness, possibly causes poor light emission due to the presence of a step. Accordingly, it is desired to provide planarization prior to forming a pixel electrode so that a light-emitting layer can be formed as planar as possible.

After forming the wirings 701 to 707, a bank 712 is formed as shown in FIG. 12. The bank 712 may be formed by patterning an insulating film or organic resin film containing silicon having 100 to 400 nm.

Incidentally, because the bank 712 is an insulating film, caution must be paid to element electrostatic breakdown during deposition. In this example added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1 \times 10^6$ to $1 \times 10^{12}$ Ωm (preferably $1 \times 10^8$ to $1 \times 10^{10}$ Ωm).

A light-emitting layer 713 is formed on the pixel electrode 711. Incidentally, although FIG. 12 shows only one pixel, this embodiment separately forms light-emitting layers correspondingly to the respective colors of R (red), G (green) and B (blue). Meanwhile, in this embodiment is formed a low molecular weight organic electroluminescent material by the deposition process. Specifically, this is a lamination structure having a copper phthalocyanine (CuPc) film provided in a thickness of 20 nm as a hole injecting layer and a tris-8-qyuinolinolato aluminum complex ($Alq_3$) film provided thereon in a thickness of 70 nm as a light-emitting layer. The color of emission light can be controlled by adding a fluorescent pigment, such as quinacridone, perylene or DCM1, to $Alq_3$.

However, the foregoing example is an example of organic electroluminescent material to be used for a light-emitting layer and not necessarily limited to this. It is satisfactory to form a light-emitting layer (layer for light emission and carrier movement therefore) by freely combining a light-emitting layer, a charge transporting layer and an electron injecting layer. For example, although in this embodiment was shown the example in which a low molecular weight organic electroluminescent material is used for a light-emitting layer, it is possible to use a high molecular weight organic electroluminescent material. Meanwhile, it is possible to use an inorganic material such as silicon carbide for an electron transporting layer or charge injecting layer. These organic electroluminescent materials or inorganic materials can be a known material.

Next, a cathode 714 of a conductive film is provided on the light-emitting layer 713. In this embodiment, as the conductive film is used an alloy film of aluminum and lithium. A known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 710, a light-emitting layer 713 and a cathode 714.

It is effective to provide a passivation film 716 in such a manner to completely cover the light-emitting element 715. The passivation film 716 is formed by an insulating film including a carbon film, a silicon nitride film or a silicon nitride oxide film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range of from room temperature to 100° C. or less, can be easily deposited over the light-emitting layer 713 low in heat resistance. Meanwhile, the DLC film, having a high blocking effect to oxygen, can suppress the light-emitting layer 713 from oxidizing. Consequently, prevented is the problem of oxidation in the light-emitting layer 713 during the following seal process.

Furthermore, a seal member 717 is provided on the passivation film 716 to bond a cover member 718. For the seal member 717 used may be an ultraviolet-ray-set resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light-emitting device having a structure as shown in FIG. 12. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFTs 601, 602, a switching TFT (n-channel TFT) 603 and a current control TFT (n-channel TFT) 604 on the substrate 700.

Furthermore, as was explained using FIG. 12, by providing an impurity region overlapped with the gate electrode through an insulating film, it is possible to form an n-channel TFT resistive to the deterioration resulting from hot-carrier effect. Consequently, a reliable light-emitting device can be realized.

Meanwhile, this example shows only the configuration of the pixel portion and driver circuit. However, according to the manufacturing process in the embodiment, besides these, it is possible to form on the same insulating member such logic circuits as a signal division circuit, a D/A converter, an operation amplifier, a γ-correction circuit or the like. Furthermore, a memory or microprocessor can be formed.

Furthermore, explained is a light-emitting device of the embodiment having done the process up to sealing (or encapsulation) for protecting the light-emitting elements, using FIG. 13. Incidentally, the reference numerals used in FIG. 12 are cited as required.

Figure 13A:
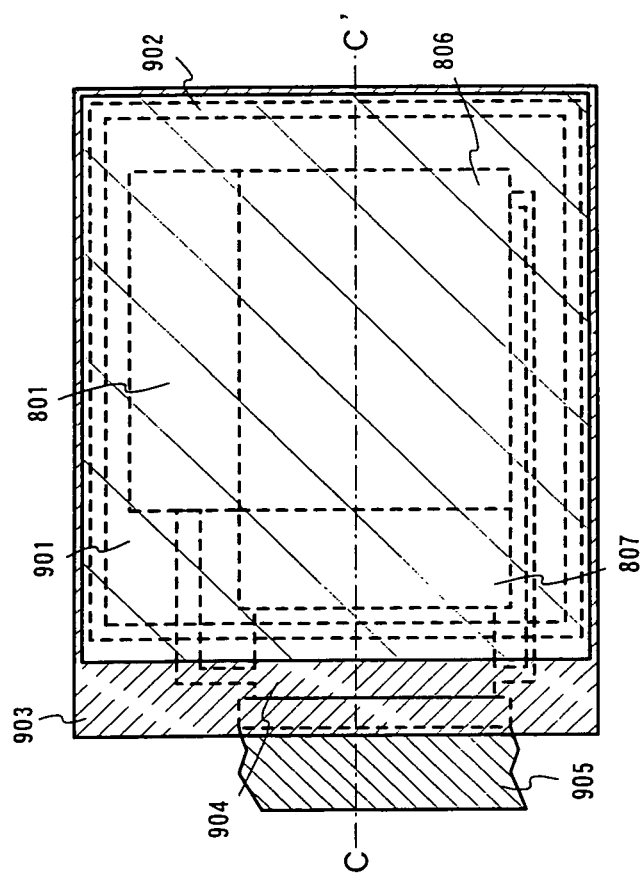
FIGS. 13A and 13B show top and sectional views, respectively, of the electroluminescence module.
Figure 13B:
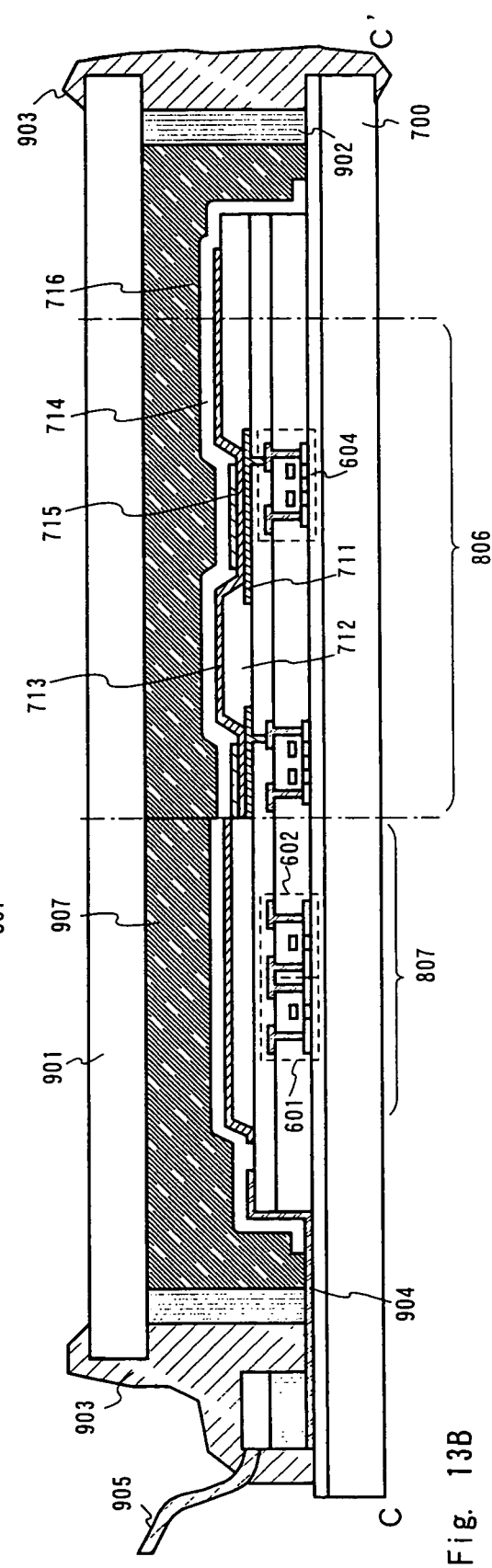
Figure 14:
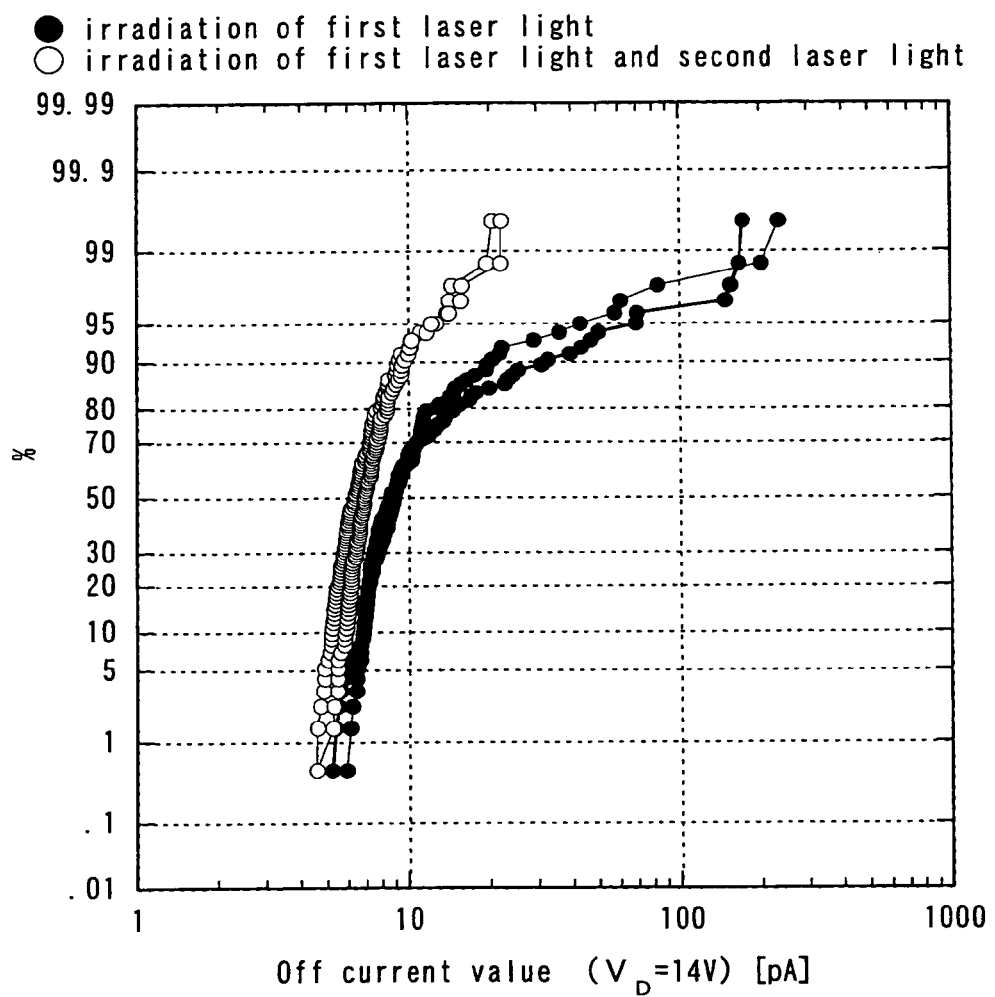
FIG. 14 shows statistics and probability distribution for off current values (Vds=14V)

FIG. 13A is a top view showing a state done up to sealing of the light-emitting elements while FIG. 13B is a sectional view taken on line C-C' in FIG. 13A. 801 designated by the dotted line is a source driver circuit, 806 a pixel portion and 807 a gate driver circuit. In addition, 901 is a cover member, 902 a first seal member and 903 a second seal member. An encapsulation material 907 is provided at the inside surrounded by the seal member 902.

Incidentally, 904 is a wiring to transmit a signal to be inputted to a source driver circuit 801 and gate driver circuit 807, to receive a video signal or clock signal from an FPC (Flexible Print Circuit) 905 as an external input terminal. Incidentally, although only FPC is shown herein, the FPC may be attached with a printed wiring board (PWB). The light-emitting device in the description includes not only a light-emitting device main body but also such a device in the state attached with an FPC or PWB.

Next, explanation is made on the sectional structure, by using FIG. 13B. The pixel portion 806 and the gate driver circuit 807 are formed on the substrate 700. The pixel portion 806 is formed with a plurality of pixels each including a current control TFT 604 and a pixel electrode 711 electrically connected to a drain thereof. Meanwhile, the gate driver circuit 807 is formed using a CMOS circuit having a combination of an n-channel TFT 601 and a p-channel TFT 602 (see FIG. 15).

The pixel electrode 711 serves as an anode of a light-emitting element. Meanwhile, banks 712 are formed on the both ends of the pixel electrode 711. On the pixel electrode 711, a light-emitting layer 713 and a cathode 714 of a light-emitting element are formed.

The cathode 714 serves also as a wiring common to all the pixels and electrically connected to the FPC 905 by way of a connection wiring 904. Furthermore, all the elements included in the pixel portion 806 and gate driver circuit 807 are covered by the cathode 715 and passivation film 714.

Meanwhile, a cover member 901 is bonded by the first seal member 902. Incidentally, a resin-film spacer may be provided in order to secure spacing between the cover member 901 and the light-emitting elements. An encapsulation material 907 is filled inside the first seal member 902. Incidentally, the first seal member 902 and encapsulation material 907 preferably uses epoxy resin. Meanwhile, the first seal member 902 is preferably of a material to transmit water and oxygen to a possible less extent. Furthermore, the encapsulation material 907 may contain a substance having a hygroscopic effect or an antioxidant effect.

The encapsulation material 907 covering the light-emitting elements serves also as an adhesive to bond the cover member 901. Meanwhile, in this embodiment, as a material for the plastic substrate forming the cover member 901 can be used, FRP (Fiberglass-Reinforced Plastics), PVF (polyvinyl Fluoride), Myler, polyester or acryl.

Meanwhile, after bonding the cover member 901 by using an encapsulation material 907, a second seal member 903 is provided so as to cover the side surface (exposed surface) of the encapsulation material 907. For the second seal member 903 can be used the same material as the first seal member 902.

With the above structure, by encapsulating the light-emitting elements in the encapsulation material 907, the light-emitting elements can be completely shielded from the outside. It is possible to prevent the intrusion, from the external, of the substance, such as water or oxygen, which accelerates the deterioration in the light-emitting layer. Thus, a reliable light-emitting device can be obtained.

Seventh Embodiment

The driver circuit and the pixel portion formed by implementing the present invention can be used in various modules (active matrix type liquid crystal module, active matrix type EL module and active matrix type EC module). That is, the present invention can be implemented in all of electronic apparatus integrated with the modules at display portions thereof.

As such electronic apparatus, there are pointed out a video camera, a digital camera, a head mount display (goggle type display), a car navigation system, a projector, a car stereo, a personal computer, a portable information terminal (mobile computer, portable telephone or electronic book) and the like. Examples of these are shown in FIGS. 17A-17F, 18A-18D, and 19A-19C.

Figure 17A:
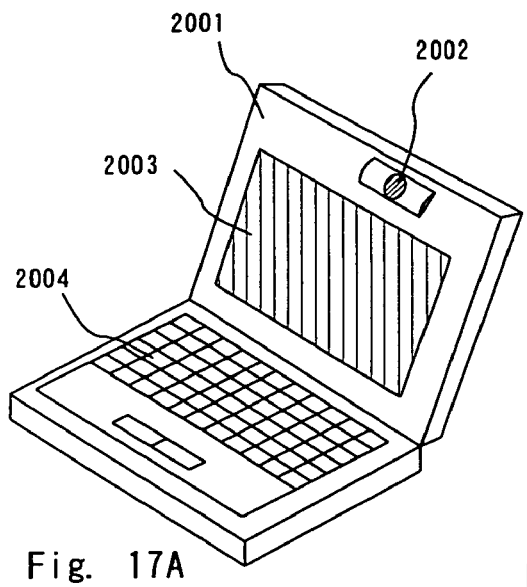
FIGS. 17A to 17F are diagrams showing examples of a semiconductor device.

FIG. 17A shows a personal computer including a main body 2001, an image input portion 2002, a display portion 2003 and a keyboard 2004. The present invention can be applied to the display portion 2003.

Figure 17B:
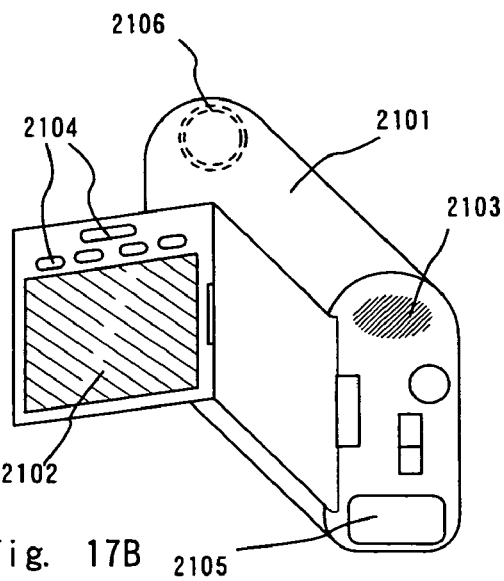

FIG. 17B shows a video camera including a main body 2101, a display portion 2102, a voice input portion 2103, operation switches 2104, a battery 2105 and an image receiving portion 2106. The present invention can be applied to the display portion 2102.

Figure 17C:
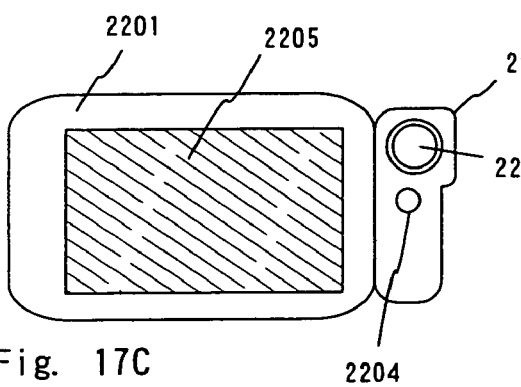

FIG. 17C shows a mobile computer including a main body 2201, a camera portion 2202, an image receiving portion 2203, an operation switch 2204 and a display portion 2205. The present invention can be applied to the display portion 2205.

Figure 17D:
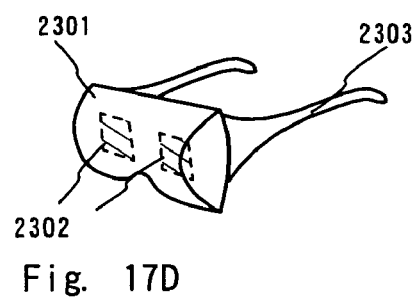

FIG. 17D shows a goggle type display including a main body 2301, a display portion 2302 and an arm portion 2303. The present invention can be applied to the display portion 2302.

Figure 17E:
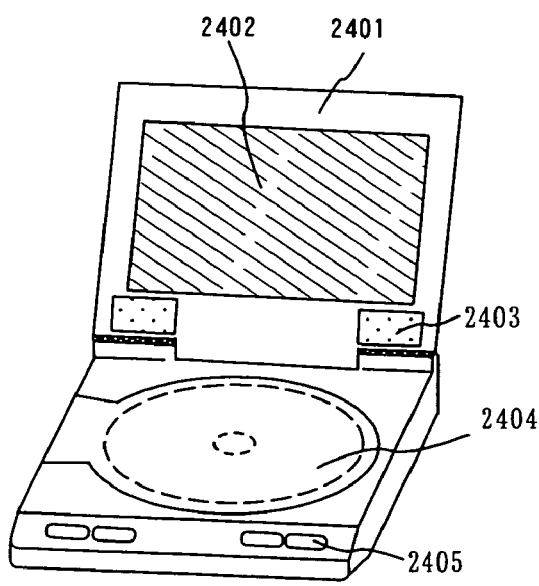

FIG. 17E shows a player using a record medium recorded with programs (hereinafter, referred to as record medium) including a main body 2401, a display portion 2402, a speaker portion 2403, a record medium 2404 and an operation switch 2405. The player uses DVD (digital Versatile Disc) or CD as the record medium and can enjoy music, enjoy movie and carry out game or Internet. The present invention can be applied to the display portion 2402.

Figure 17F:
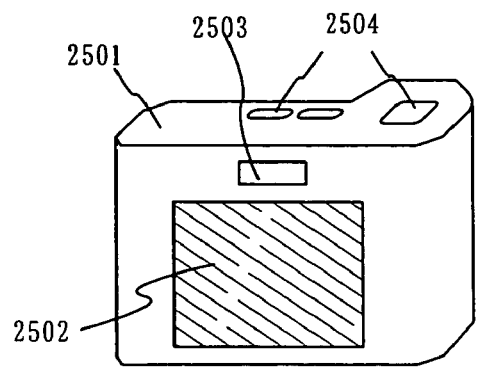

FIG. 17F shows a digital camera including a main body 2501, a display portion 2502, an eye contact portion 2503, operation switches 2504 and an image receiving portion (not illustrated). The present invention can be applied to the display portion 2502.

Figure 18A:
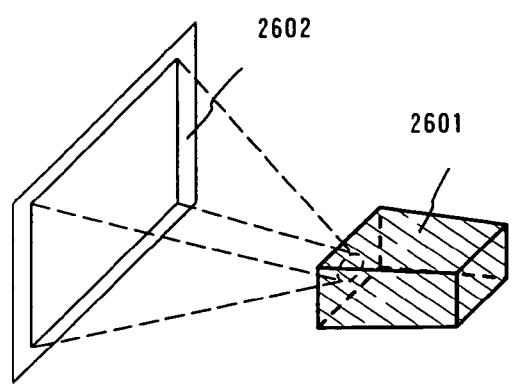
FIGS. 18A to 18D are diagrams showing examples of the semiconductor device.

FIG. 18A shows a front type projector including a projection apparatus 2601 and a screen 2602. The present invention can be applied to the liquid crystal module 2808 forming a part of the projection apparatus 2601.

Figure 18B:
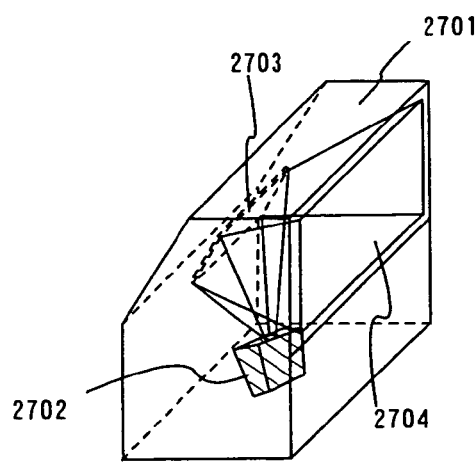

FIG. 18B shows a rear type projector including a main body 2701, a projection apparatus 2702, a mirror 2703 and a screen 2704. The present invention can be applied to the liquid crystal display device 2808 forming a part of the projection apparatus 2702.

Figure 18C:
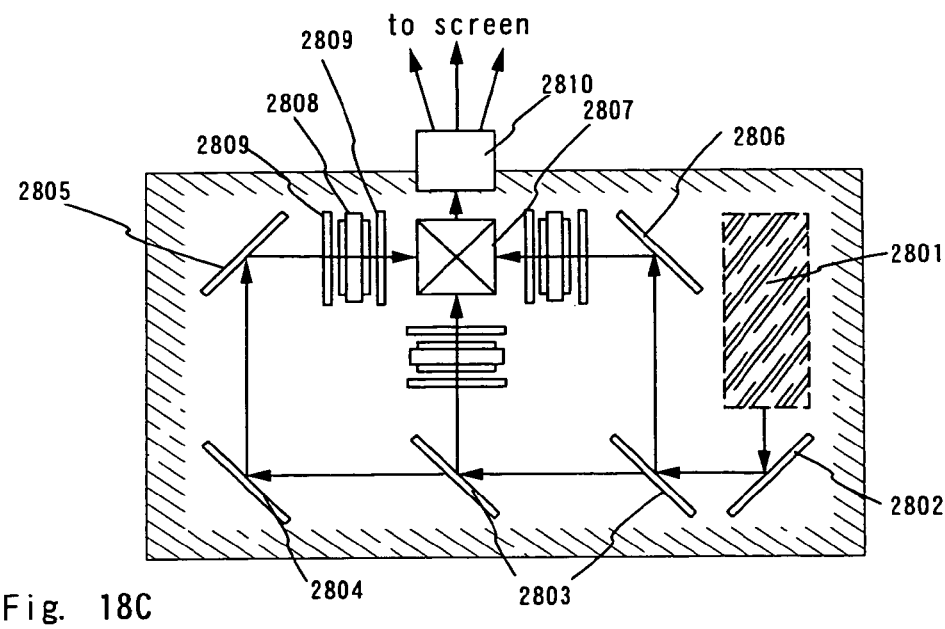

Further, FIG. 18C is a view showing an example of a structure of the projection apparatus 2601 and 2702 in FIG. 18A and FIG. 18B. The projection apparatus 2601 or 2702 is constituted by a light source optical system 2801, mirrors 2802, and 2804 through 2806, a dichroic mirror 2803, a prism 2807, a liquid crystal display apparatus 2808, a phase difference plate 2809 and a projection optical system 2810. The projection optical system 2810 is constituted by an optical system including a projection lens. Although this embodiment shows an example of three plates type, this example is not particularly limited thereto but may be of, for example, a single plate type. Further, person of executing this embodiment may pertinently provide an optical system such as an optical lens, a film having a polarization function, a film for adjusting a phase difference or an IR film in an optical path shown by arrow marks in FIG. 18C.

Figure 18D:
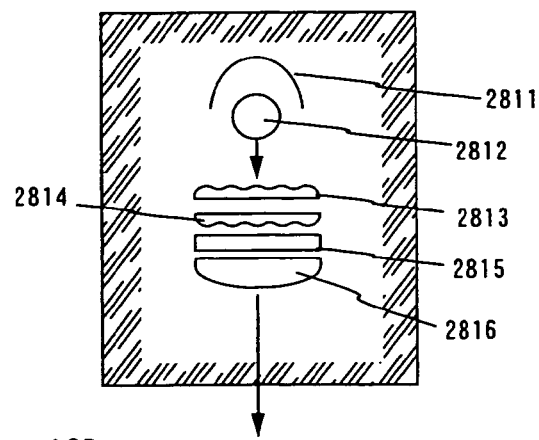

Further, FIG. 18D is a view showing an example of a structure of the light source optical system 2801 in FIG. 18C. According to this embodiment, the light source optical system 2801 is constituted by a reflector 2811, a light source 2812, lens arrays 2813 and 2814, a polarization conversion element 2815 and a focusing lens 2816. Further, the light source optical system shown in FIG. 18D is only an example and this example is not particularly limited thereto. For example, a person of executing this example may pertinently provide an optical system such as an optical lens, a film having a polarization function, a film for adjusting a phase difference or an IR film in the light source optical system.

However, according to the projectors shown in FIG. 18, there is shown a case of using a transmission type electro-optical device and an example of applying a reflection type electro-optical device and EL module are not illustrated.

Figure 19A:
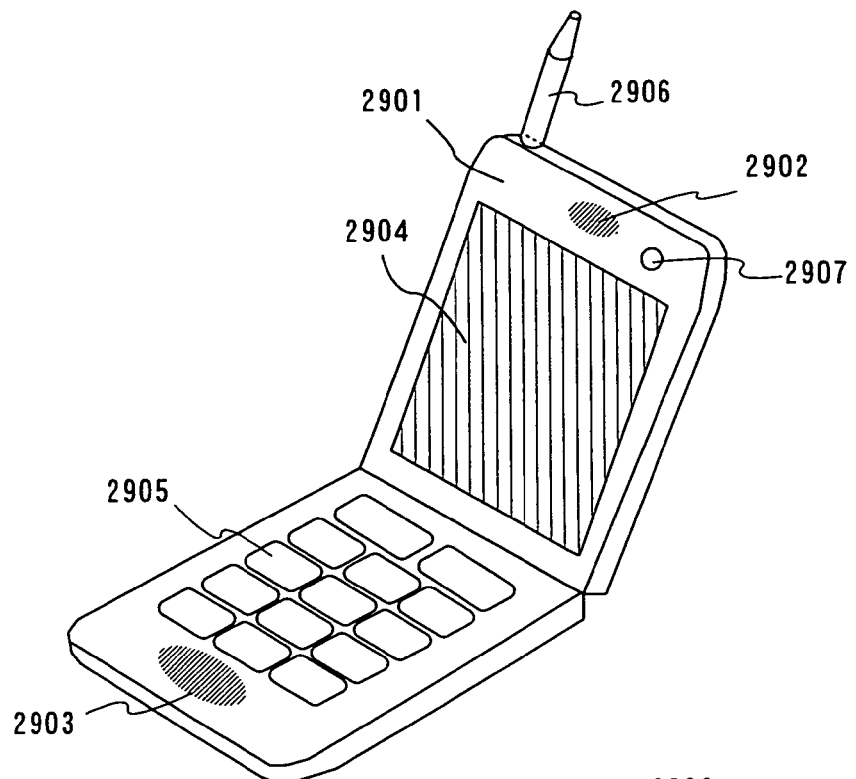
FIGS. 19A to 19C are diagrams showing examples of the semiconductor device.

FIG. 19A shows a portable telephone including a main body 2901, a sound output portion 2902, a sound input portion 2903, a display portion 2904, an operation switch 2905, an antenna 2906 and an image input portion (CCD, image sensor or the like) 2907. The present invention can be applied to display portion 2904.

Figure 19B:
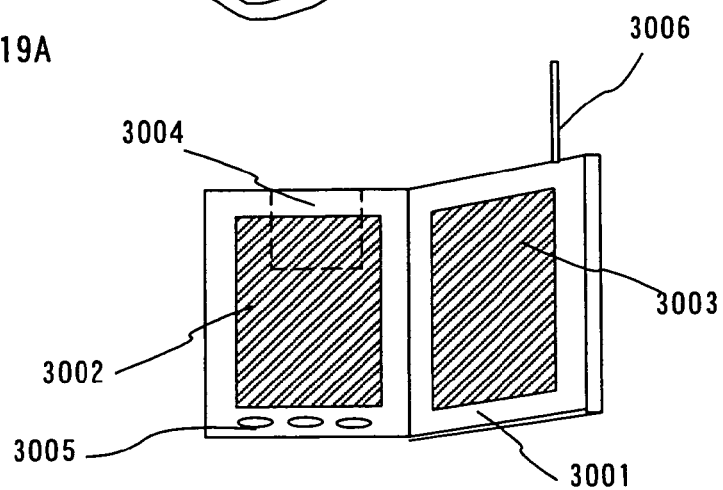

FIG. 19B shows a portable book (electronic book) including a main body 3001, display portion 3002, 3003, a record medium 3004, an operation switch 3005 and an antenna 3006. The present invention can be applied to display portions 3002 and 3003.

Figure 19C:
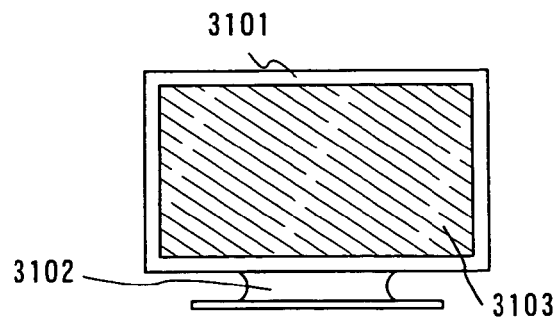
Figure 21A:
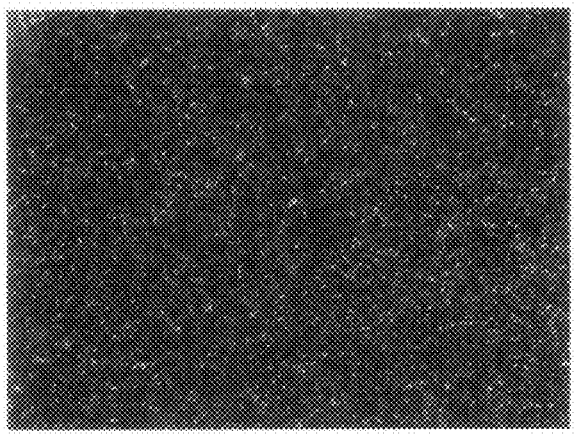
FIGS. 21A to 21C are diagrams of photographs showing experiment results, respectively.
Figure 21B:
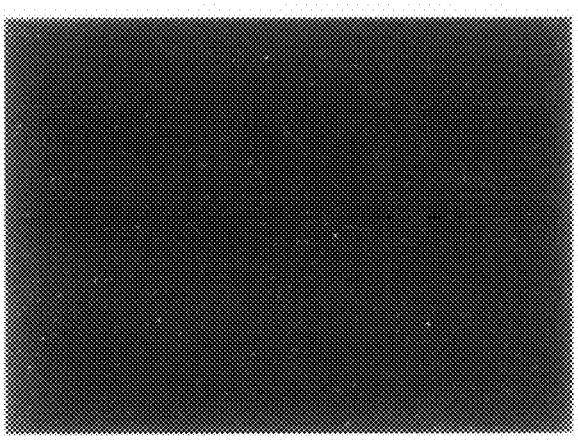
Figure 21C:
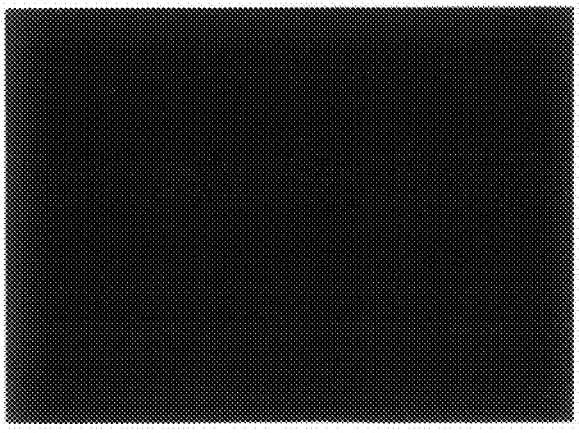
Figure 22A:
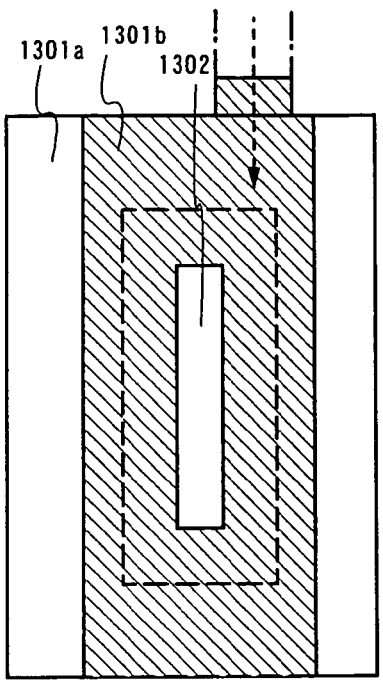
FIGS. 22A and 22B are diagrams showing an example of a laser irradiating apparatus.
Figure 22B:
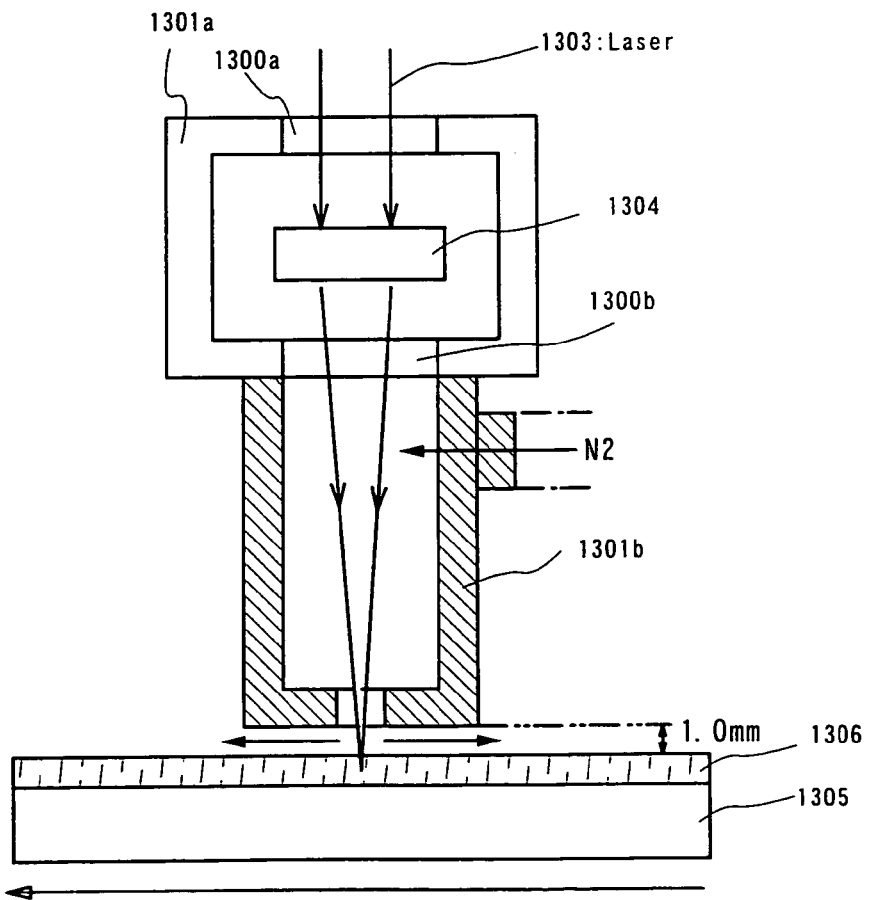

FIG. 19C shows a display including a main body 3101, a support base 3102 and a display portion 3103. The present invention can be applied to display portion 3103.

In addition, the display shown in FIG. 19C is small and medium type or large type, for example, screen of the display sized 5 to 20 inches. Moreover, it is preferable to mass-produce by executing a multiple pattern using a substrate sized 1×1 m to form such sized display section.

As has been described, the range of applying the present invention is extremely wide and is applicable to electronic apparatus of all the fields. The electronic apparatus of the present invention can be implemented by freely combined with the structures in embodiments 1 to 6.

According to the present invention, when a semiconductor film is annealed by using laser, an atmosphere can be controlled, which is required for flattening the semiconductor film, by using an inexpensive construction. Further, according to the present invention, the flat characteristic of the semiconductor can be improved significantly. Especially, an off current value of a TFT can be reduced, and the variation can be suppressed. Accordingly, an operational characteristic of a semiconductor device using the TFT can be improved, and the power consumption can be reduced.

What is claimed is:

1. A method for manufacturing a semiconductor device comprising:
   forming a semiconductor film on an insulating surface; and
   blowing an inert gas with an oxygen density of 10 ppm or less to the semiconductor film without intrusion of the air and, at the same time, irradiating the semiconductor film with a laser light through an opening portion of a plate in order to anneal the semiconductor film.

2. A method of manufacturing a semiconductor device according to claim 1, wherein the inert gas is nitrogen, noble gas, hydrogen or a mixture thereof.

3. A method of manufacturing a semiconductor device according to claim 1, wherein the inert gas is heated to 50° C. or above.

4. A method of manufacturing a semiconductor device according to claim 3, wherein the inert gas contains 0.1 to 5% of hydrogen.

5. A method of manufacturing a semiconductor device according to claim 1, wherein the laser light has linear energy distribution on the surface of the semiconductor film.

6. A method of manufacturing a semiconductor device according to claim 1, wherein the inert gas is injected from the plate located immediately above the semiconductor film.

7. A method of manufacturing a semiconductor device according to claim 6, wherein a distance between the semiconductor film and the plate is 0.01 to 1 mm.

8. A method of manufacturing a semiconductor device according to claim 1, wherein the laser light is excimer laser light or YAG laser light.

9. A method of manufacturing a semiconductor device according to claim 1, wherein the laser light is XeCl excimer laser light, KrF excimer laser light, a basic wave of YAG laser, a second harmonic of YAG laser or a third harmonic of YAG laser.

10. The semiconductor device according to claim 1, wherein the semiconductor device is incorporated into an electronic appliance selected from the group consisting of a personal computer, a video camera, a mobile computer, a goggle type display, a player, a digital camera, a front type projector, a rear type projector, a portable telephone, a portable book, and a display.

11. A method for manufacturing a semiconductor device comprising:

forming a semiconductor film on an insulating surface; and
irradiating the semiconductor film with a laser light through an opening portion of a plate in order to anneal the semiconductor film, the plate being levitated above the semiconductor film by an injected inert gas or a gas containing oxygen.

12. A method for manufacturing a semiconductor device according to claim 11, wherein the plate has a window through which laser light passes.

13. A method of manufacturing a semiconductor device according to claim 11, wherein the plate has a window through which laser light passes on the laser light incident side and the opening portion on the laser light emitting side.

14. A method of manufacturing a semiconductor device according to claim 11, wherein the inert gas is nitrogen, noble gas, hydrogen or a mixture thereof.

15. A method of manufacturing a semiconductor device according to claim 11, wherein the inert gas is heated to 50° C. or above.

16. A method of manufacturing a semiconductor device according to claim 15, wherein the inert gas contains 0.1 to 5% of hydrogen.

17. A method of manufacturing a semiconductor device according to claim 11, wherein the laser light has linear energy distribution on the surface of the semiconductor film.

18. A method of manufacturing a semiconductor device according to claim 11, wherein the inert gas is injected from the plate located immediately above the semiconductor film.

19. A method of manufacturing a semiconductor device according to claim 18, wherein a distance between the semiconductor film and the plate is 0.01 to 1 mm.

20. A method of manufacturing a semiconductor device according to claim 11, wherein the laser light is excimer laser light or YAG laser light.

21. A method of manufacturing a semiconductor device according to claim 11, wherein the laser light is XeCl excimer laser light, KrF excimer laser light, a basic wave of YAG laser, a second harmonic of YAG laser or a third harmonic of YAG laser.

22. The semiconductor device according to claim 11, wherein the semiconductor device is incorporated into an electronic appliance selected from the group consisting of a personal computer, a video camera, a mobile computer, a goggle type display, a player, a digital camera, a front type projector, a rear type projector, a portable telephone, a portable book, and a display.

23. A method for manufacturing a semiconductor device comprising:
forming a semiconductor film on an insulating surface; and
irradiating the semiconductor film with a laser light through an opening portion of a plate in order to anneal the semiconductor film, the plate being levitated above the semiconductor film by an injected inert gas with an oxygen density of 10 ppm or less.

24. A method for manufacturing a semiconductor device according to claim 23, wherein the plate has a window through which laser light passes.

25. A method of manufacturing a semiconductor device according to claim 23, wherein the plate has a window through which laser light passes on the laser light incident side and the opening portion on the laser light emitting side.

26. A method of manufacturing a semiconductor device according to claim 23, wherein the inert gas is nitrogen, noble gas, hydrogen or a mixture thereof.

27. A method of manufacturing a semiconductor device according to claim 23, wherein the inert gas is heated to 50° C. or above.

28. A method of manufacturing a semiconductor device according to claim 27, wherein the inert gas contains 0.1 to 5% of hydrogen.

29. A method of manufacturing a semiconductor device according to claim 23, wherein the laser light has linear energy distribution on the surface of the semiconductor film.

30. A method of manufacturing a semiconductor device according to claim 23, wherein the inert gas is injected from the plate located immediately above the semiconductor film.

31. A method of manufacturing a semiconductor device according to claim 30, wherein a distance between the semiconductor film and the plate is 0.01 to 1 mm.

32. A method of manufacturing a semiconductor device according to claim 23, wherein the laser light is excimer laser light or YAG laser light.

33. A method of manufacturing a semiconductor device according to claim 23, wherein the laser light is XeCl excimer laser light, KrF excimer laser light, a basic wave of YAG laser, a second harmonic of YAG laser or a third harmonic of YAG laser.

34. The semiconductor device according to claim 23, wherein the semiconductor device is incorporated into an electronic appliance selected from the group consisting of a personal computer, a video camera, a mobile computer, a goggle type display, a player, a digital camera, a front type projector, a rear type projector, a portable telephone, a portable book, and a display.

35. A method for manufacturing a semiconductor device comprising:
forming a semiconductor film on an insulating surface; and
irradiating the semiconductor film with a laser light through an opening portion of a plate in order to anneal the semiconductor film, the plate being levitated above the semiconductor film by an injected gas.

36. A method for manufacturing a semiconductor device according to claim 35, wherein the plate has a window through which laser light passes.

37. A method of manufacturing a semiconductor device according to claim 35, wherein the plate has a window through which laser light passes on the laser light incident side and the opening portion on the laser light emitting side.

38. A method of manufacturing a semiconductor device according to claim 35, wherein the injected gas is an inert gas selected from the group consisting of nitrogen, noble gas, hydrogen or a mixture thereof.

39. A method of manufacturing a semiconductor device according to claim 35, wherein the injected gas is heated to 50° C. or above.

40. A method of manufacturing a semiconductor device according to claim 39, wherein the inert gas contains 0.1 to 5% of hydrogen.

41. A method of manufacturing a semiconductor device according to claim 35, wherein the laser light has linear energy distribution on the surface of the semiconductor film.

42. A method of manufacturing a semiconductor device according to claim 35, wherein the inert gas is injected from the plate located immediately above the semiconductor film.

43. A method of manufacturing a semiconductor device according to claim 42, wherein a distance between the semiconductor film and the plate is 0.01 to 1 mm.

44. A method of manufacturing a semiconductor device according to claim 35, wherein the laser light is excimer laser light or YAG laser light.

45. A method of manufacturing a semiconductor device according to claim 35, wherein the laser light is XeCl excimer laser light, KrF excimer laser light, a basic wave of YAG laser, a second harmonic of YAG laser or a third harmonic of YAG laser.

46. The semiconductor device according to claim 35, wherein the semiconductor device is incorporated into an electronic appliance selected from the group consisting of a personal computer, a video camera, a mobile computer, a goggle type display, a player, a digital camera, a front type projector, a rear type projector, a portable telephone, a portable book and a display.

* * * * *